(12) United States Patent
Zhao

(10) Patent No.: US 8,040,079 B2
(45) Date of Patent: Oct. 18, 2011

(54) PEAK DETECTION WITH DIGITAL CONVERSION

(75) Inventor: Bin Zhao, Irvine, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 386 days.

(21) Appl. No.: 12/424,326

(22) Filed: Apr. 15, 2009

(65) Prior Publication Data

US 2010/0264837 A1 Oct. 21, 2010

(51) Int. Cl.
*H05B 37/02* (2006.01)
(52) U.S. Cl. ............. 315/299; 327/74; 327/77; 315/308
(58) Field of Classification Search .................. 315/291, 315/294, 299, 308; 327/57, 74, 75, 76, 77
See application file for complete search history.

(56) References Cited

U.S. PATENT DOCUMENTS

| | | | |
|---|---|---|---|
| 3,973,197 | A | 8/1976 | Meyer |
| 4,162,444 | A | 7/1979 | Rodgers |
| 4,615,029 | A | 9/1986 | Hu et al. |
| 4,649,432 | A | 3/1987 | Watanabe et al. |
| 4,686,640 | A | 8/1987 | Simison |
| 5,025,176 | A | 6/1991 | Takeno |
| 5,038,055 | A | 8/1991 | Kinoshita |
| 5,455,868 | A | 10/1995 | Sergent et al. |
| 5,508,909 | A | 4/1996 | Maxwell et al. |
| 5,635,864 | A * | 6/1997 | Jones ............................. 327/77 |
| 5,723,950 | A | 3/1998 | Wei et al. |
| 6,002,356 | A | 12/1999 | Cooper |
| 6,281,822 | B1 | 8/2001 | Park |
| 6,373,423 | B1 * | 4/2002 | Knudsen ....................... 341/159 |
| 6,636,104 | B2 | 10/2003 | Henry |
| 6,822,403 | B2 | 11/2004 | Horiuchi et al. |
| 6,864,641 | B2 | 3/2005 | Dygert |
| 6,943,500 | B2 | 9/2005 | LeChevalier |
| 7,262,724 | B2 | 8/2007 | Hughes et al. |
| 7,307,614 | B2 | 12/2007 | Vinn |

(Continued)

FOREIGN PATENT DOCUMENTS

JP 2003332624 A 11/2003

(Continued)

OTHER PUBLICATIONS

PCT Application No. PCT/US2010/028289; Search Report and Written Opinion dated Dec. 15, 2010.

(Continued)

*Primary Examiner* — Thuy Vinh Tran

(57) ABSTRACT

A peak detection/digitization circuit includes a plurality of level detect units, each having a comparator and a flip-flop with a clock input responsive to the output of the comparator. For a detection period, each level detect unit configures a data output signal of the flip-flop to a first data state responsive to a start of the detection period. Further, each level detect unit is configured to enable the comparator responsive to the data output signal having the first data state or a second data state, respectively. While the comparator is enabled during the detection period, the level detect unit configures the data output signal of the flip-flop responsive to a comparison of an input signal to a corresponding reference voltage level by the comparator. The data output signals of the flip-flops of the level detect units at the end of the detection period are used to determine a digital value representative of a peak voltage level of the input signal.

20 Claims, 12 Drawing Sheets

U.S. PATENT DOCUMENTS

| | | | |
|---|---|---|---|
| 7,315,095 | B2 | 1/2008 | Kagemoto et al. |
| 7,391,280 | B2 | 6/2008 | Hsu |
| 7,436,378 | B2 | 10/2008 | Ito et al. |
| 7,459,959 | B2 | 12/2008 | Rader et al. |
| 7,511,545 | B1 | 3/2009 | Kesler |
| 7,696,915 | B2 * | 4/2010 | Chmelar et al. ............ 341/159 |
| 7,777,704 | B2 | 8/2010 | S et al. |
| 7,973,495 | B2 | 7/2011 | Ion et al. |
| 2004/0208011 | A1 | 10/2004 | Horiuchi et al. |
| 2004/0233144 | A1 | 11/2004 | Rader et al. |
| 2006/0164162 | A1 | 7/2006 | Dauphinee et al. |
| 2006/0186830 | A1 | 8/2006 | Shami et al. |
| 2006/0261895 | A1 | 11/2006 | Kocaman et al. |
| 2007/0080911 | A1 | 4/2007 | Liu et al. |
| 2007/0253330 | A1 | 11/2007 | Tochio et al. |
| 2008/0054815 | A1 | 3/2008 | Kotikalapoodi |
| 2008/0297067 | A1 | 12/2008 | Wang et al. |
| 2009/0108775 | A1 | 4/2009 | Sandner et al. |
| 2009/0128045 | A1 | 5/2009 | Szczeszynski et al. |
| 2009/0187925 | A1 * | 7/2009 | Hu et al. .................. 719/327 |
| 2009/0230874 | A1 | 9/2009 | Zhao et al. |
| 2009/0230891 | A1 * | 9/2009 | Zhao et al. ................ 315/308 |
| 2009/0273288 | A1 | 11/2009 | Zhao et al. |
| 2009/0315481 | A1 | 12/2009 | Zhao |
| 2010/0013395 | A1 | 1/2010 | Archibald et al. |
| 2010/0013412 | A1 | 1/2010 | Archibald et al. |
| 2010/0026203 | A1 | 2/2010 | Zhao et al. |
| 2010/0085295 | A1 | 4/2010 | Zhao et al. |
| 2010/0156315 | A1 | 6/2010 | Zhao et al. |

FOREIGN PATENT DOCUMENTS

| | | |
|---|---|---|
| JP | 2005116199 A | 4/2005 |
| KR | 1020070082004 A | 8/2007 |
| WO | 2005022596 A2 | 3/2005 |

OTHER PUBLICATIONS

Notice of Allowance mailed Apr. 7, 2011 for U.S. Appl. No. 12/326,963, 20 pages.
Non-Final Office Action mailed Apr. 19, 2011 for U.S. Appl. No. 12/363,294, 19 pages.
Non-Final Office Action mailed Apr. 19, 2011 for U.S. Appl. No. 12/363,607, 17 pages.
Office Action—NFOA Feb. 4, 2010, 11 pages.
Office Action—NOA Jun. 2, 2010, 7 pages.
Office Action—NOA Jul. 9, 2010, 12 pages.
International App. No. PCT/US2009/065913, Search Report mailed Jul. 7, 2010, 4 pages.
Mc Nerney, Tim, "constant-current power supply for Luxeon 5W LED with low-voltage warning and shut-off Software Documentation, as shipped to Mali in first 45 prototypes," Nov. 2004, www.designthatmatters.org/ke/pubs/kled-doc.txt, 5 pages.
Maxim: "Application Note 810, Understanding Flash ADCs," Oct. 2, 2001, 8 pages.
National Semiconductor Data Sheet: "LM3432/LM3432B 6-Channel Current Regulator for LED Backlight Application," May 22, 2008, pp. 1-18.
U.S. Appl. No. 12/537,443, filed Aug. 7, 2009, entitled Pulse Width Modulation Frequency Conversion.
U.S. Appl. No. 12/703,239, filed Feb. 10, 2010, entitled "Pulse Width Modulation With Effective High Duty Resolution".
U.S. Appl. No. 12/537,692, filed Aug. 7, 2009, entitled "Phase-Shifted Pulse Width Modulation Signal Generation".
U.S. Appl. No. 12/625,818, filed Nov. 25, 2009, entitled "Synchronized Phase-Shifted Pulse Width Modulation Signal Generation".
U.S. Appl. No. 12/703,249, filed Feb. 10, 2010, entitled "Duty Transition Control in Pulse Width Modulation Signaling".
Luke Huiyong Chung, Electronic Products: "Driver ICs for LED BLUs," May 1, 2008, 3 pages.
Akira Takahashi, Electronic Products: "Methods and features of LED drivers," Mar. 2008, 3 pages.
U.S. Appl. No. 12/340,985, filed Dec. 22, 2008, entitled "LED Driver With Feedback Calibration".
U.S. Appl. No. 12/326,963, filed Dec. 3, 2008, entitled "LED Driver With Precharge and Track/Hold".
U.S. Appl. No. 12/367,672, filed Feb. 9, 2009, entitled "Configuration for Dynamic Power Control in LED Displays".
Texas Instruments Publication, "Interleaved Dual PWM Controller with Programmable Max Duty Cycle," SLUS544A, (UCC28220, UCC28221) Sep. 2003, pp. 1-28.
U.S. Appl. No. 12/504,841, filed Jul. 17, 2009, entitled "Analog-to-Digital Converter With Non-Uniform Accuracy".
U.S. Appl. No. 12/690,972, filed Jan. 21, 2010, entitled "Serial Cascade of Minimum Tail Voltages of Subsets of LED Strings for Dynamic Power Contrl in LED Displays".
U.S. Appl. No. 12/363,607, filed Jan. 30, 2009, entitled "LED Driver With Dynamic Headroom Control".
International Application No. PCT/US2009/035284, Search Report and Written Opinion, Oct. 28, 2009, 11 pages.
Notice of Allowance mailed Jun. 21, 2011 for U.S. Appl. No. 12/340,985, 27 pages.
Non-Final Office Action mailed May 4, 2011 for U.S. Appl. No. 12/367,672, 26 pages.
Notice of Allowance mailed Aug. 1, 2011 for U. S. Appl. No. 12/363,294, 11 pages.
Ex parte Quayle mailed Jul. 20, 2011 for U. S. Appl. No. 12/363,179, 25 pages.
Notice of Allowance mailed Aug. 11, 2011 for U. S. Appl. No. 12/363,607, 9 pages.

* cited by examiner

PEAK DETECTION WITH DIGITAL CONVERSION

FIELD OF THE DISCLOSURE

The present disclosure relates to peak voltage level detection and analog-to-digital conversion.

BACKGROUND

Peak detectors are used in many applications to determine the peak level (negative or positive) of an analog signal over some specified period. A digital representation of the detected peak level, obtained via an analog-to-digital converter (ADC), is useful for further signal processing or control purposes. Conventional peak detectors typically detect the peak voltage level via a sample-and-hold process over the sample period, followed by use of an ADC that converts the detected peak voltage level to a corresponding digital code. Flash-type ADCs are frequently used as the ADC in this conversion process. A conventional flash ADC utilizes a parallel bank of comparators to generate a corresponding thermometer code, which is then decoded to generate a corresponding digital output value. However, the conventional utilization of these parallel comparators in the flash ADC can result in excessive power consumption. The sample-and-hold circuit of a peak detector likewise consumes substantial power, as well as requiring considerable circuit layout space. Accordingly, an improved method for peak voltage detection and digitization of the detected peak voltage would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
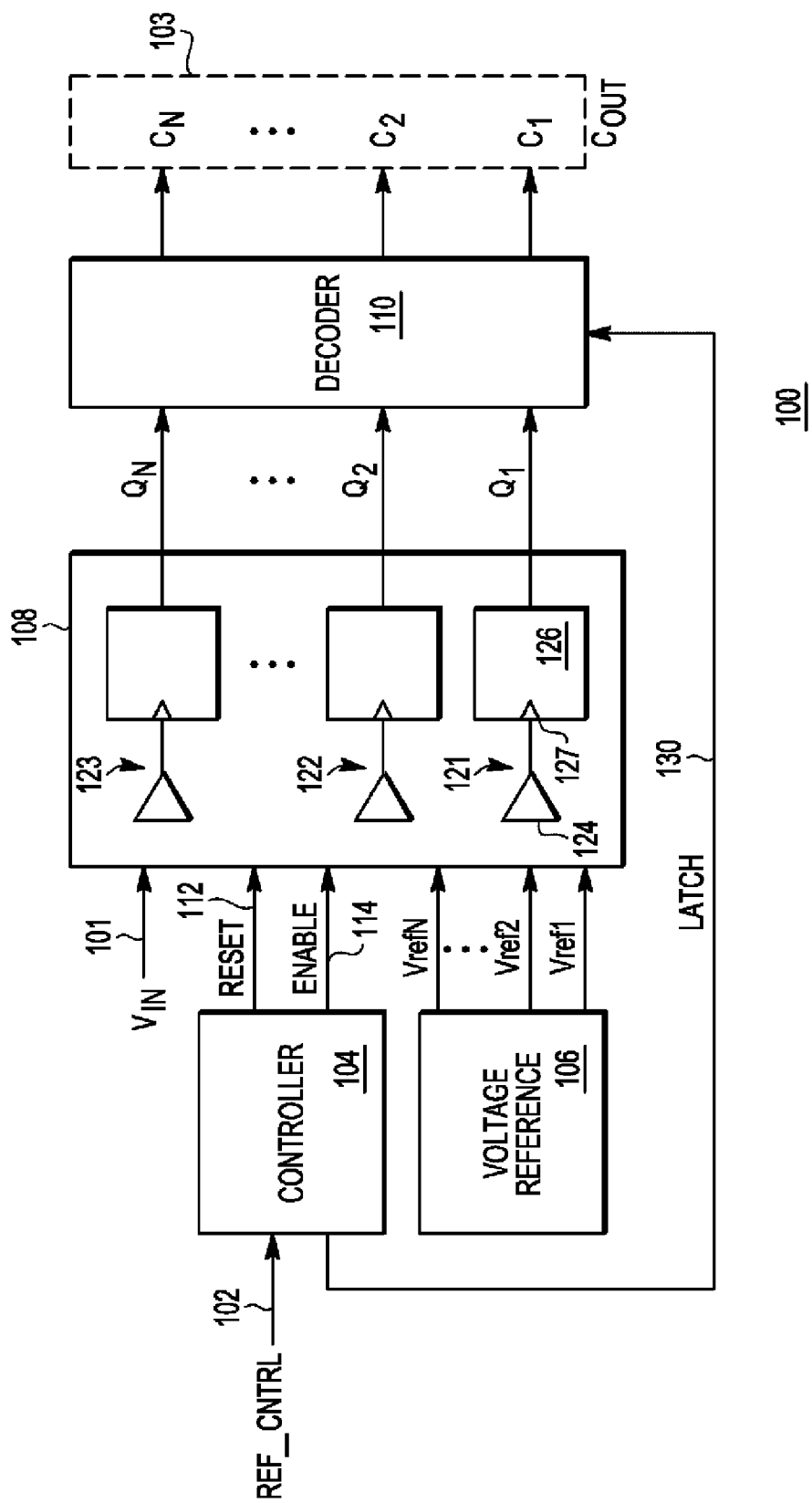
FIG. 1 is a diagram illustrating a peak detection/digitization circuit in accordance with at least one embodiment of the present disclosure.

FIG. 1 illustrates a peak detection/digitization circuit 100 in accordance with at least one embodiment of the present disclosure. As a general overview, the peak detection/digitization circuit 100 receives an analog input signal 101 (having a potentially varying voltage level $V_{IN}$), detects a peak voltage level ($V_P$) of the analog input signal 101 over a specified detection period determined based on a reference control signal 102 (REF_CNTRL), and generates a multiple-bit digital code value 103 ($C_{OUT}$) representative of the detected peak voltage level $V_P$. The peak voltage level $V_P$ can comprise a negative peak voltage level (i.e., the minimum voltage level over the specified detection period) or a positive peak voltage level (i.e., the maximum voltage level over the specified detection period) depending on the particular implementation of the peak detection/digitization circuit 100. FIGS. 2-4, 7, and 8 illustrate example implementations for negative peak detection and digitization, and FIGS. 5, 6, 9, and 10 illustrate example implementations for positive peak detection and digitization.

Figure 11:
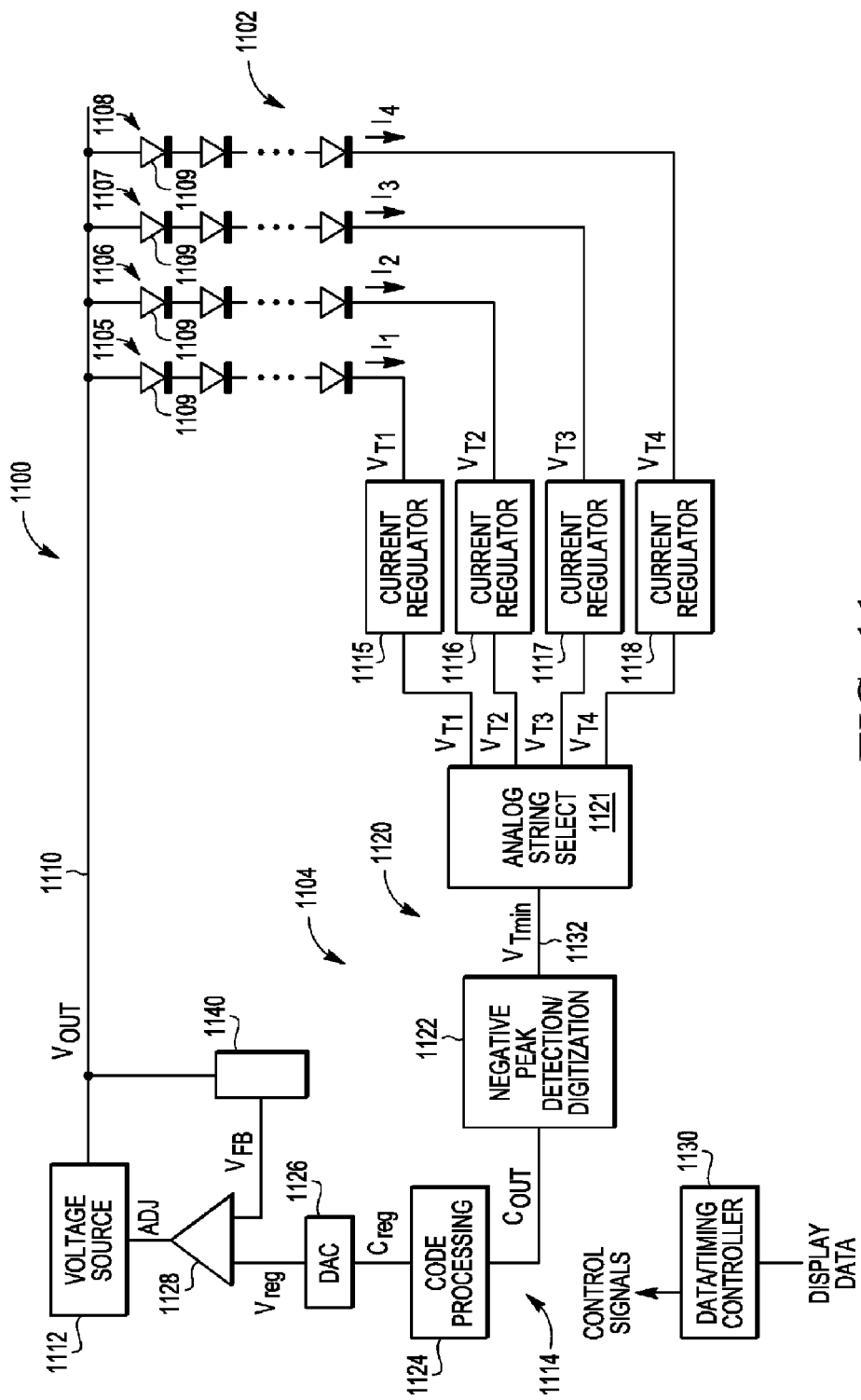
FIG. 11 is a diagram illustrating an example light emitting diode (LED) system implementing the peak detection/digitization circuit of FIG. 1 for dynamic headroom control in accordance with at least one embodiment of the present disclosure.
Figure 12:
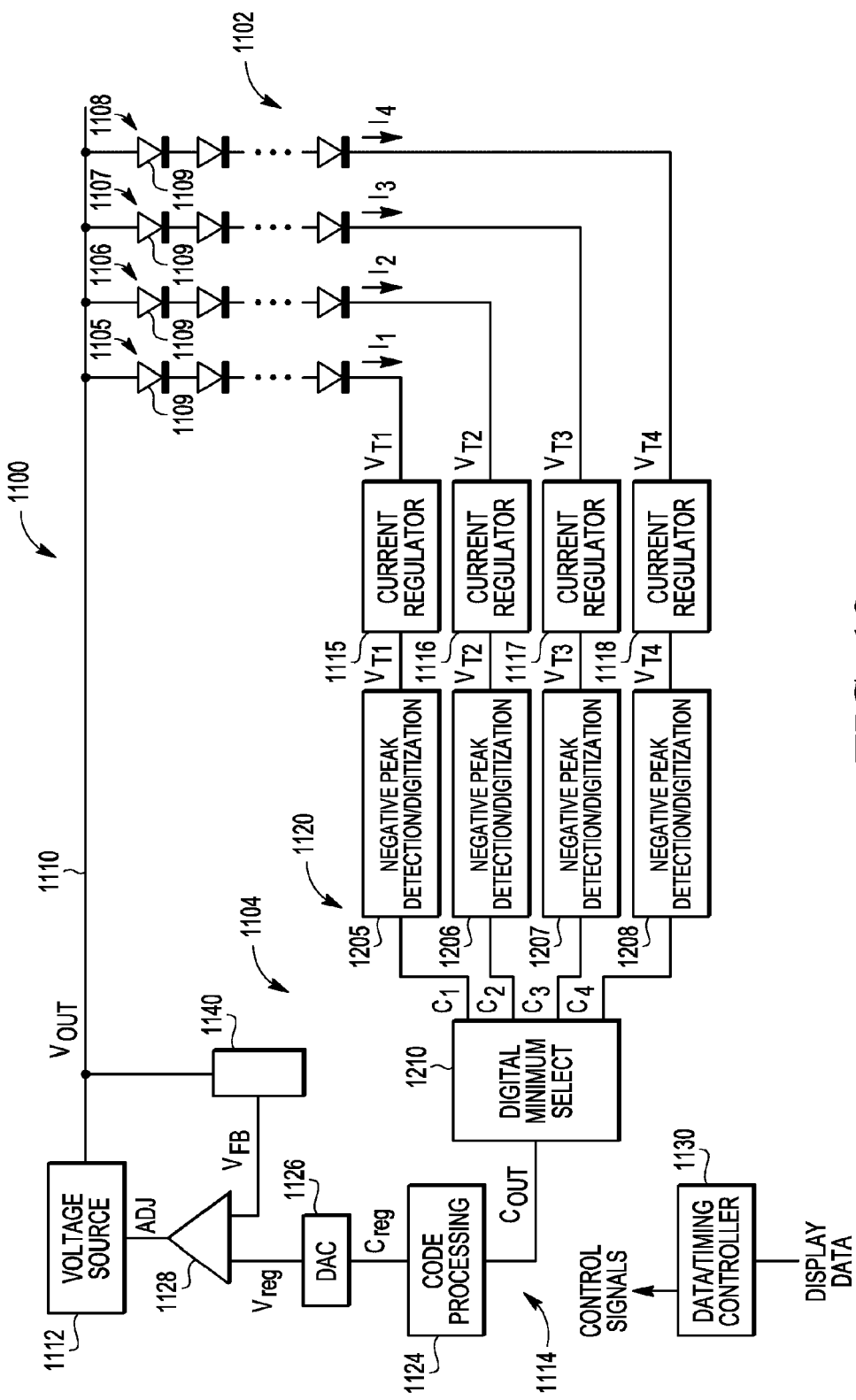
FIG. 12 is a diagram illustrating another example light emitting diode (LED) system implementing the peak detection/digitization circuit of FIG. 1 for dynamic headroom control in accordance with at least one embodiment of the present disclosure.

In the depicted example, the peak detection/digitization circuit 100 comprises a controller 104, a reference voltage source 106, a digitizer 108, and a decoder 110. The controller 104 receives the reference control signal 102 and uses this signal to generate various control signals, including a reset signal 112 and an enable signal 114. As described in greater detail below, the reset signal 112 signals the timing of two modes: a detect mode in which the level detect units 121, 122, and 123 of the digitizer 108 are configured to detect a peak level of the analog input signal 101 over a corresponding detection period; and a reset mode, in which the level detect units are reset to an initial configuration in preparation for the peak detection process of the following detection period. The enable signal 114, in one embodiment, is used to activate certain components prior to a detection period so as to ensure proper power-up of the components at the start of the detection period. The reference control signal 102 can include any of a variety of periodic or pseudo-periodic signals, such as a central processing unit (CPU) clock. As illustrated in FIGS. 11 and 12, the reference control signal 102 can include a timing reference associated with display data, such as a display frame timing reference.

The reference voltage source 106 generates a plurality of reference voltages (Vref1, Vref2, . . . , VrefN) distributed between a minimum voltage level (e.g., ground or 0 volts) and a maximum voltage level, whereby the span between the minimum voltage level and the maximum voltage level represents an expected voltage range of the analog input signal 101. The reference voltage source 106 can be implemented as, for example, a plurality of separate voltage sources, as a resistor ladder or diode ladder, and the like.

The digitizer 108 includes inputs to receive the analog input signal 101, the reset signal 112, the enable signal 114, and the plurality of reference voltages (Vref1, Vref2, . . . , VrefN), an output to provide a plurality of digital output values ($Q_1, Q_2, \ldots, Q_N$), and a plurality of level detect units (e.g., level detect units 121, 122, and 123). Each level detect unit is to generate a corresponding one of the digital output values based on the analog input signal 101, the reset signal 112, the enable signal 114, and a corresponding one of the reference voltages. Each of the level detect units includes a comparator 124 and a flip-flop 126, whereby the output of the comparator 124 is configured based on a comparison of the voltage level $V_{IN}$ of the analog input signal 101 with a corresponding reference voltage. The operation of the flip-flop 126 is controlled based on the state of the output of the comparator 124 and the reset signal 112. The state of an output of the flip-lop 126 is provided as the corresponding digital output value $Q_x$ (X=1, 2, ..., N) to the decoder 110. As described in greater detail below, the flip-flop 126 can have two outputs that are complementary, either of which can be used as the corresponding digital output value (with corresponding configuration of the decoder 110). Further, in at least one embodiment, the comparator 124 can be selectively disabled based on the output of the flip-flop 126 (as well as the enable signal 114) so as to reduce power consumption while the operation of the comparator 124 is unnecessary.

The digitizer 108 operates in two modes: a reset mode and a detect mode. The controller 104 uses the reference control signal 102 to determine the transitions between the two modes via the reset signal 112. The reset mode is represented by the reset signal 112 having the reset state "R" and the detect mode is represented by the reset signal 112 having the reset state "\R". Thus, the start of a detection period is signaled by a transition of the reset signal 112 from reset state "R" to reset state "\R" and the end of the detection period is signaled by a transition of the reset signal 112 from reset state "\R" to reset state "R". For ease of reference, the symbol "\" refers to the inverted state or complement state of the corresponding signal. Thus, "\Z" refers to the complement of "Z", or "Z".

The comparator 124 is configured to compare the voltage level $V_{IN}$ of the analog input signal 101 to the corresponding reference voltage VrefX and configure the comparator state of the output accordingly. When the voltage level $V_{IN}$ does not exceed the reference voltage VrefX, the comparator 124 has an output state "\C". Conversely, the voltage level $V_{IN}$ exceeds the reference voltage VrefX (X=1, 2, ..., N), the comparator 124 has an output state "C". When the comparator 124 is disabled, the output of the comparator 124 can have either the "C" or "\C" comparator state, depending on the particular internal configuration of the comparator 124. In a positive peak detection context, the voltage level $V_{IN}$ "exceeds" the reference voltage VrefX when the voltage level $V_{IN}$ is higher than the reference voltage VrefX. Conversely, in a negative peak detection context, the voltage level $V_{IN}$ "exceeds" the reference voltage VrefX when the voltage level $V_{IN}$ is lower than the reference voltage VrefX. Table 1 summarizes the operation of the comparator 124:

TABLE 1

Operation of the comparator 124

| Mode | $V_{IN}$/VrefX | Output State |
|---|---|---|
| Disabled | X | X (C or \C) |
| Enabled | $V_{IN}$ does not exceed VrefX | \C |
|  | $V_{IN}$ exceeds VrefX | C |

As used herein, the state "X" refers to a "don't care" state such that whether the particular value is a "0" or "1" is not relevant to the corresponding operation.

The flip-flop 126 has a data input fixed to a particular data state and a data output that provides a corresponding one of the plurality of digital output values ($Q_1, Q_2, \ldots, Q_N$). Further, the flip-flop 126 has a clock input 127 connected to the output of the comparator 124. As described below, the flip-flop 126 can have two complementary data outputs (referred to herein as "primary data output" and "complementary data output"), and the particular one of these two data outputs utilized to provide the corresponding digital output value depends on the particular implementation. For ease of discussion, the operation of the flip-flop 126 is described in a context whereby the primary data output is used to provide the corresponding digital output value and to control the selective enabling/disabling of the comparator 124. However, the complementary data output can be used for one or both of these uses with the corresponding adaptation to the logic and connections of the components of the level detect unit, as described herein.

While in reset mode (i.e., while the reset signal 112 has reset state "R"), the flip-flop 126 configures its primary data output to a predetermined data state "\D" (which is the complementary state of the data state "D" to which the data input is fixed) regardless of the state of the output of the comparator 124. While in detect mode (i.e., while the reset signal 112 has reset state "\R"), the flip-flop 126 configures its data output based on the state of the output of the comparator 124 as received at the clock input 127 of the flip-flop 126. If the output of the comparator 124 has the state "\C" (i.e., the voltage level $V_{IN}$ of the analog input signal 101 does not exceed the corresponding reference voltage VrefX), the flip-flop 126 maintains the primary data output at the present data state (e.g., the same data state "\D" if the primary data output has not changed since reset). If the output of the comparator 124 has the state "C" (i.e., the voltage level $V_{IN}$ of the analog input signal 101 exceeds the corresponding reference voltage VrefX), the flip-flop 126 configures the primary data output to the same data state as is received at the data input of the flip-flop 126, i.e., propagates the input data state "D" to the primary data output. In response to the output of the comparator 124 switching from the state "C" to "\C", the flip-flop 126 latches the primary data output to the data state at the primary data output when the output state of the comparator was state "C" and maintains the primary data output at this data state until the output of the comparator 124 is at the state "C" again. The primary data output of the flip-flop 126 is set to "\D" again only upon reset (i.e., while the reset signal 112 has reset state "R"). Table 2 summarizes the operation of the flip-flop 126:

TABLE 2

Operation of Flip-Flop 126

| Mode | Comparator Output | Data Output of Flip-Flop |
|---|---|---|
| Reset ("R") | X | \D |
| Detect ("\R") | C | D |
|  | \C | Latch state of data output:<br>1) upon reset or<br>2) at clk = C → \C transition |

As illustrated in greater detail below, the comparator 124 of a level detect unit is selectively enabled based on the state of the data output of the flip-flop 126 of the level detect unit such that the comparator 124 is enabled while the primary data output of the flip-flop 126 has the state "\D" (and thus the complementary data output of the flip-flop 126 has the state "D"). Conversely, the comparator 124 is disabled when the primary data output of the flip-flop 126 has the state "D" (and thus the complementary data output of the flip-flop 126 has the state "\D"). As a result, the comparator 124 is enabled during the detection period so long as the voltage $V_{IN}$ has not exceeded the corresponding reference VrefX. The combined operation of the comparator 124 and the flip-flop 126 of a level detect unit has the effect of maintaining the corresponding digital output value Qx of the level detect unit at an initial state for the detection period unless the voltage level $V_{IN}$ of the analog input signal 101 exceeds the reference voltage VrefX, at which point the level detect unit inverts the state of the digital output value Qx and maintains the digital output value $Q_x$ at this inverted state until the end of the detection period (at which point the level detect unit is reset). Thus, the "peak" (negative or positive) of the voltage level $V_{IN}$ of the analog input signal 101 over the detection period is represented by the particular combination of states of the outputs of the level detect units at the end of the detection period.

The decoder 110 includes a plurality of data inputs, each data input connected to the data output of the flip-flop 126 of a corresponding level detect unit. At the end of the detection period, the controller 104 asserts a latch signal, which directs the decoder 110 to latch the digital output values ($Q_1$, $Q_2$, ..., $Q_N$) of the level detect units and to generate from the latched digital output values ($C_1$, $C_2$, ..., $C_N$) of the digital code value 103 ($C_{OUT}$) representative of the peak voltage level of the analog input signal 101 over the detection period. In one embodiment, the digital output values together directly represent the peak voltage level (i.e., $C_{OUT}=[Q_N \ldots Q_2\ Q_1]$) and thus the decoder 110 can operate merely as a plurality of latches. In other embodiments, the decoder 110 can implement any of a variety of decode processes to generate the digital code value 103 from the latched digital output values ($Q_1, Q_2, \ldots, Q_N$), such as by converting the thermometer code to binary code, and the like.

The peak detection/digitization circuit configuration of FIG. 1 and as further described herein affords a number of advantages over conventional peak detectors and digitizers. For one, reduced power consumption is achieved by disabling the comparator 124 of a level detect unit for the remainder of the detection period once the voltage level $V_{IN}$ of analog input signal 101 has exceeded the reference voltage VrefX associated with the level detect unit. In contrast, flash ADCs and other parallel comparator-based digitizers conventionally do not provide a mechanism to disable unnecessary comparators, thereby allowing these unnecessary comparators to continue to consume power. As another advantage, this peak detection/digitization circuit configuration eliminates the need for a track-and-hold circuit often found in conventional peak detection circuits, thereby reducing power consumption and the layout area requirements compared to conventional peak detection circuits.

Figure 2:
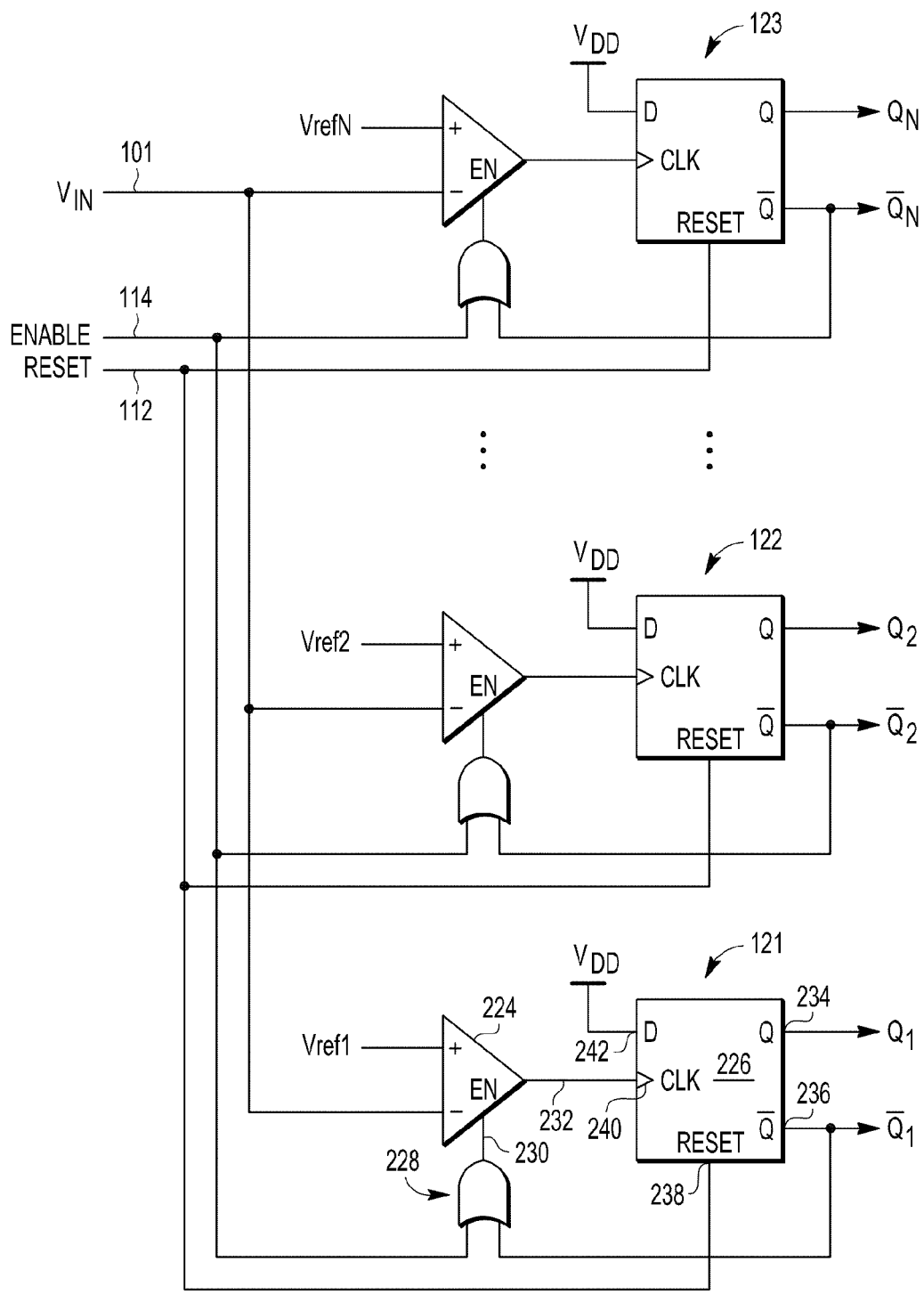
FIG. 2 is a diagram illustrating an example implementation of level detect units of the peak detection/digitization circuit of FIG. 1 for negative peak detection in accordance with at least one embodiment of the present disclosure.

FIG. 2 illustrates an example implementation of the digitizer 108 of the peak detection/digitization circuit 100 of FIG. 1 for negative peak detection in accordance with at least one embodiment of the present disclosure. The digitizer 108 includes the plurality of level detect units (e.g., level detect units 121-123). Each of the level detect units is associated with a different reference voltage of the plurality of reference voltages. To illustrate, the level detect unit 121 is associated with reference voltage Vref1, the level detect unit 122 is associated with reference voltage Vref2, and the level detect unit 123 is associated with the reference voltage VrefN.

In the depicted example, each of level detect units 121-123 includes a comparator 224 (corresponding to comparator 124, FIG. 1), a flip-flop 226 (corresponding to flip-flop 126, FIG. 1), and an enable/disable mechanism 228. The comparator 224 of a level detect unit includes a negative input to receive the analog input signal 101, a positive input to receive the corresponding reference voltage VrefX (where VrefX=Vref1 for level detect unit 121, VrefX=Vref2 for level detect unit 122, and VrefX=VrefN for level detect 123), an input to receive an enabling signal 230, and an output to provide a compare signal 232. The comparator 224 is enabled when the enabling signal 230 is set to a state "EN" and disabled when the enabling signal 230 is set to a state "\EN". When enabled, the comparator 224 sets its output state to "\C" (or logic "0" in this example) when the voltage level $V_{IN}$ not lower than the corresponding reference voltage VrefX and the comparator 224 sets its output state to "C" (or "logic "1" in this example) when the voltage level $V_{IN}$ is lower than the corresponding reference voltage VrefX.

The flip-flop 226 of a level detect unit includes a data input to receive a fixed voltage representative of a predetermined data state "D", a primary data output 234 ($Q_x$), a complementary data output 236 ($\backslash Q_x$), a reset input 238 to receive the reset signal 112, and a clock input 240 ("clk") coupled to the output of the comparator 224 to receive the compare signal 232. In the implementation of FIG. 2, the data input 242 of the flip-flop 226 is fixed to the voltage $V_{DD}$, thereby setting the predetermined data input state "D" to a logic "1". Accordingly, when the reset signal 112 is configured to the reset "R" state (e.g., logic "1" in this example), the flip-flop 226 operates to reset the primary data output 234 to the complement of data state "D"; that is, data state "\D" or logic "0" and to reset the complementary data output 236 to the complement of the primary data output 234; that is, data state "D" or logic "1".

The enable/disable mechanism 228 of a level detect unit selectively enables and disables the comparator 224 of the level detect unit based on the states of the enable signal 114 and one of the data outputs of the flip-flop 226 of the level detect unit. In the illustrated example, while either the enable signal 114 is asserted or while the primary data output 234 has the data state "0" (or the complementary data output 236 has the data state "1"), the enable/disable mechanism 228 sets the enabling signal 230 to state "EN" to enable the comparator 224. While both the enable signal 114 is deasserted and the primary data output 234 has the data state "1" (or the complementary data output 236 has the data state "0"), the enable/disable mechanism 228 sets the enabling signal 230 to state "\EN" to disable the comparator 224. Thus, in operation the enable/disable mechanism 228 maintains the comparator 224 in an enabled state during a detection period until (and if) the voltage level $V_{IN}$ of the analog input signal 101 falls below the corresponding reference voltage VrefX.

The enable/disable mechanism 228 can be implemented using any of a variety of logic configurations to achieve the above-described operation. As FIG. 2 illustrates, the enable/disable mechanism 228 can be implemented as a logic-OR gate comprising an input to receive the enable signal 114, an input coupled to the complementary data output 236, and an output to provide the enabling signal 230. Alternately, the enable/disable mechanism 228 can be implemented as, for example, in inverter having an input to receive the enable signal 114 and an output, and a logic-NAND gate having an input coupled to the primary data output 234, an input coupled to the output of the inverter, and an output to provide the enabling signal 230. In implementations whereby the enable signal 114 is not used to power-up the comparators 224 before the start of the detection period, the enable/disable mechanism 228 can be implemented by, for example, directly coupling the output of the complementary data output 236 to the enable input of the comparator 224, or by coupling the primary data output 234 to the enable input of the comparator 224 via an inverter.

Tables 3, 4, and 5 summarize the operations of the comparator 224, flip-flop 226, and enable/disable mechanism 228 of a level detect unit of the implementation of FIG. 2.

TABLE 3

Operation of Comparator 224

| Mode | $V_{IN}$/VrefX | Output State |
|---|---|---|
| Disabled | X | X (0 or 1) |
| Enabled | $V_{IN}$ < VrefX | 1 |
|  | $V_{IN}$ > VrefX | 0 |

TABLE 4

Operation of Flip-Flop 226

| Mode | Comparator Output | Primary Data Output | Complementary Data Output |
|---|---|---|---|
| Reset ("R") | X | 0 | 1 |
| Detect ("\R") | 1 | 1 | 0 |
|  | 0 | Latch state of primary data output: 1) upon reset or 2) at clk = 1 → 0 transition | Latch state of complementary data output: 1) upon reset or 2) at clk = 1 → 0 transition |

TABLE 5

Operation of Enable/Disable Mechanism 228

| Enable Signal 114 | Complementary Data Output 236 | Enabling Signal 230 |
|---|---|---|
| 0 | 0 | 0 |
| 0 | 1 | 1 |
| 1 | 0 | 1 |
| 1 | 1 | 1 |

Figure 3:
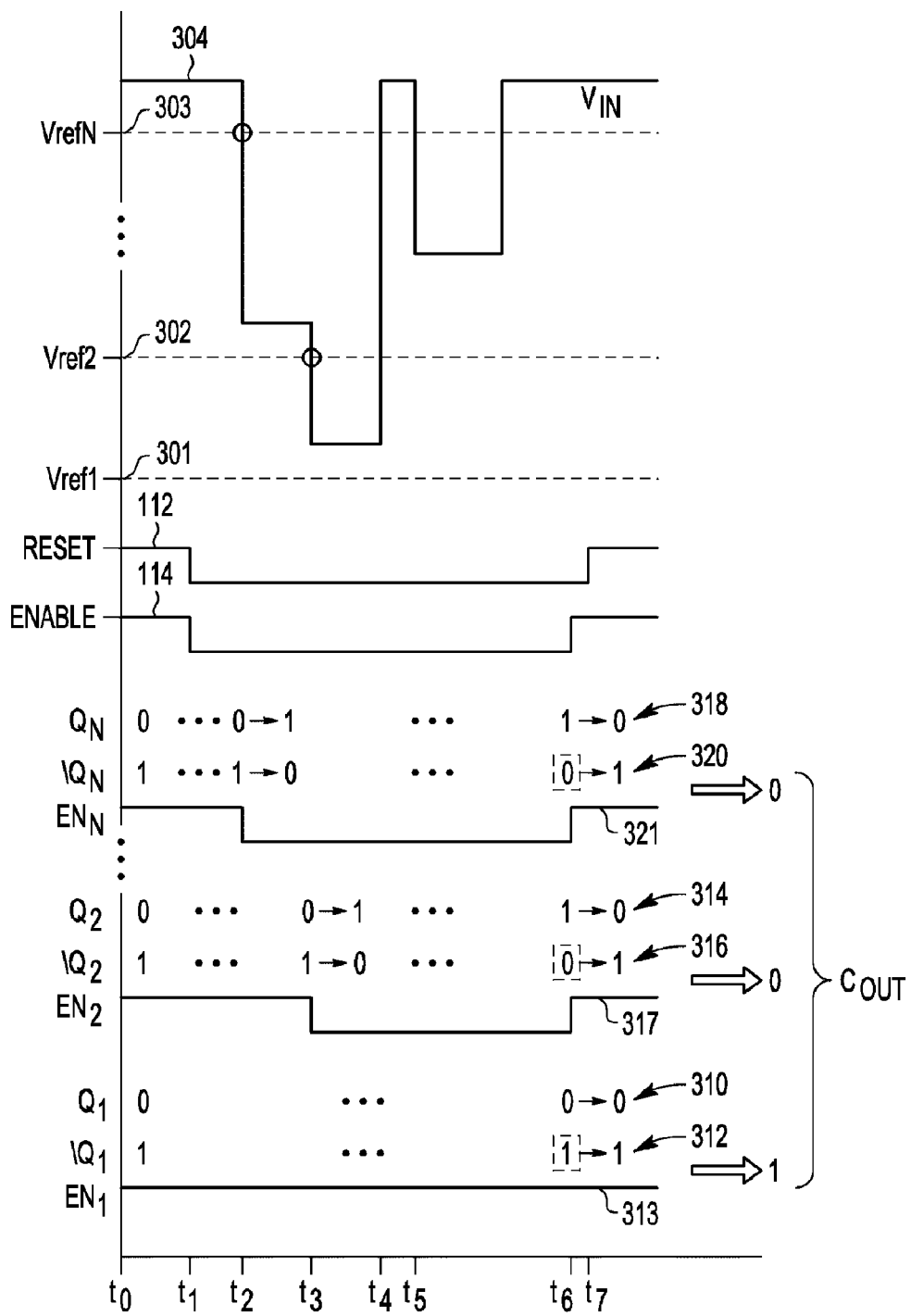
FIG. 3 is a chart illustrating an example operation of the implementation of FIG. 2 in accordance with at least one embodiment of the present disclosure.
Figure 4:
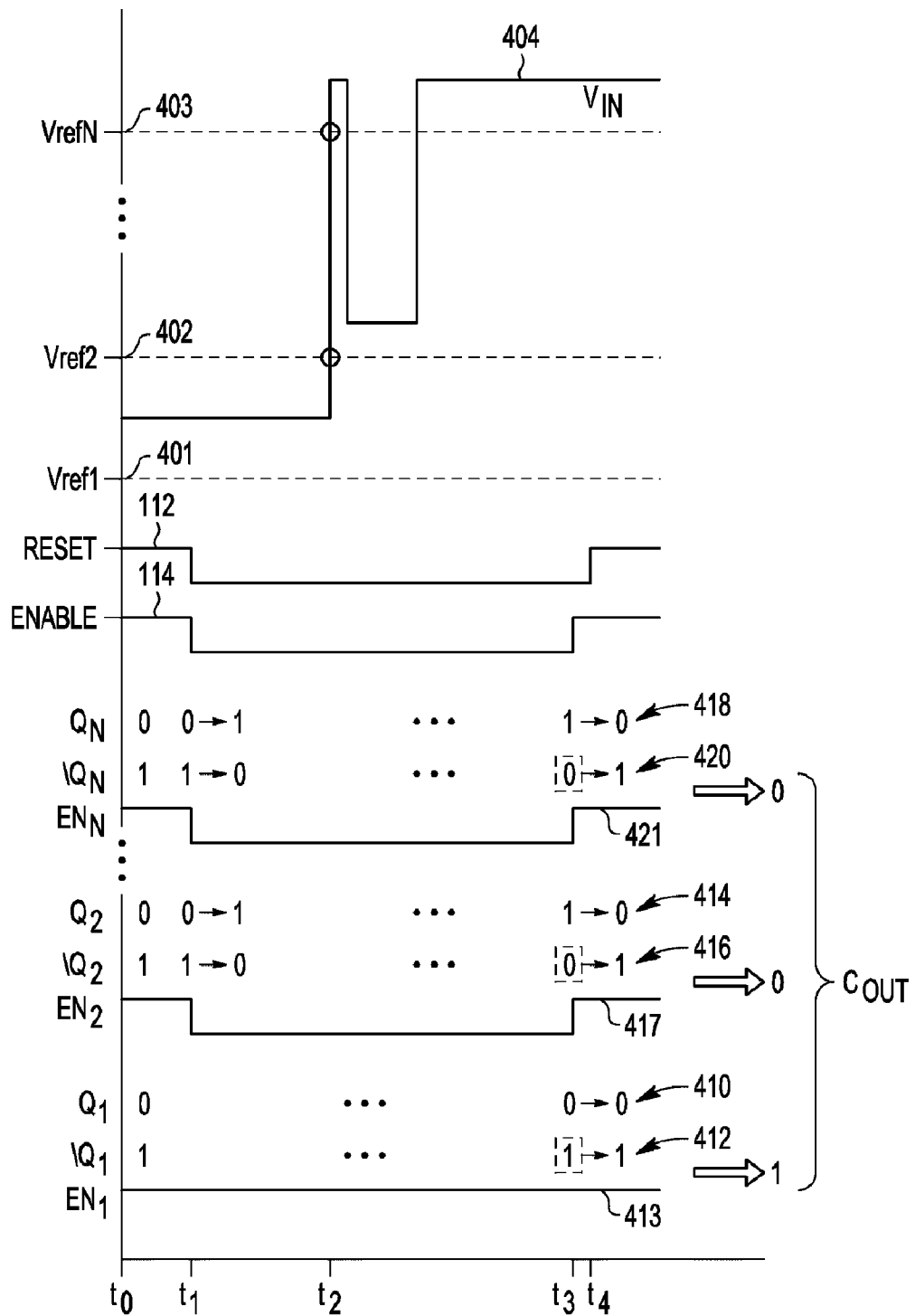
FIG. 4 is a chart illustrating another example operation of the implementation of FIG. 2 in accordance with at least one embodiment of the present disclosure.

FIGS. 3 and 4 are charts illustrating example operations of the implementation of digitizer 108 of FIG. 2 for negative peak detection. FIG. 3 illustrates a chart 300 illustrating the operation in a situation whereby the voltage level $V_{IN}$ of the analog input signal 101 is higher than the highest reference voltage VrefN at the start of the detection period. In chart 300, levels 301, 302, and 303 represent the levels of reference voltages Vref1, Vref2, and VrefN, respectively, and line 304 represents the voltage level $V_{IN}$ of the analog input signal 101. While the voltage level $V_{IN}$ is illustrated as changing instantaneously (i.e., a sharp/sudden rise or fall) for simplicity in FIG. 3 (and in subsequent charts), it will be appreciated that, in practice, the changes in the voltage level $V_{IN}$ are more gradual (i.e., with some slope). This distinction does not affect the operation of the techniques described herein. Data value sequences 310 and 312 represent the states ("0" or "1") of the data signals output by the primary data output 234 and the complementary data output 236, respectively, of the flip-flop 226 of the level detect unit 121 and the line 313 represents the state of the enabling signal 230 for the level detect unit 121. Data value sequences 314 and 316 represent the data output states of the primary data output and the complementary data output, respectively, of the flip-flop 226 of the level detect unit 122. The line 317 represents the state of the enabling signal 230 for the level detect unit 122. Data value sequences 318 and 320 represent the data output states of the primary data output and the complementary data output, respectively, of the flip-flop 226 of the level detect unit 123. The line 321 represents the state of the enabling signal 230 for the level detect unit 123. Ellipses (". . . ") are used in the data value sequences to indicate there is no change in the state of the corresponding data output.

The start and end of the detection period is represented by times t1 and t7, respectively. Prior to the start of the detection period (e.g., at time t0), the reset signal 112 is set to the state "R" (logic "1" in this example), thereby resetting the flip-flops 226 of the level detect units 121-123 so that their primary data outputs are set to logic "0" ("\D") and their complementary data outputs are set to logic "1" ("D"). Further, prior to the start of the detection period, the enable signal 114 is asserted so as to initiate the power-up of the comparators 224 of the level detect units 121-123 so that the comparators 224 are fully operational at the start of the detection period at time t1.

At time t1, the start of the detection period is signaled by reconfiguring the reset signal 112 to state "\R" (e.g., logic "0"). Concurrently, the enable signal 114 is deasserted so as to allow the comparators 224 to be selectively enabled or disabled solely based on the state of the data outputs of the corresponding flip-flops 226 during the detection period. At the start of the detection period, the voltage level $V_{IN}$ is higher than all of the reference voltages, and thus the primary data outputs of the level detect units 121-123 remain at logic "0" as set during the reset mode, and conversely, the complementary data outputs of the level detect units 121-123 remain at logic "1" as set during the reset mode. As the complementary data outputs are at logic "1", the enabling signals 230 of the level detect units 121-123 remain asserted and thus the comparators 224 of the level detect units 121-123 remain enabled.

At time t2, the voltage level $V_{IN}$ falls below the reference voltage VrefN, which is associated with the level detect unit 123. Consequently, in accordance with the operation of the comparator 224 and the flip-flop 226 described above, the primary data output of the flip-flop 226 of the level detect unit 123 is inverted to a logic state "1" and the complementary data output is inverted to a logic state "0". As a result, the enabling signal 230 of the level detect unit 123 is deasserted (as shown by line 321), thereby disabling the comparator 224 of the level detect unit 123 until the enable signal 114 is again asserted at the end of the detection period at time t6. Due to the operation of the flip-flop 226 described above, the primary data output and the complementary data output of the level detect unit 123 remain latched at their current states until the end of the detection period. Thus, the level detect unit 123 retains this triggered state irrespective of any subsequent change in the relationship between the reference voltage VrefN and the voltage level $V_{IN}$ during the remaining portion of the detection period, such as when the voltage level $V_{IN}$ once again becomes higher than the reference voltage VrefN at time t4 or again falls below the reference voltage VrefN at time t5.

At time t3, the voltage level $V_{IN}$ falls below the reference voltage Vref2. In response, the level detect unit 122 switches its primary and complementary data outputs (as illustrated by the changes in the data value sequences 314 and 316 at time t3) and disables the comparator 224 of the level detect unit 122 (as illustrated by the line 317 at time t3) in manner described above with respect to the level detect unit 123.

At time t4, the voltage level $V_{IN}$ again rises above both reference voltages Vref2 and VrefN and at time t5 the voltage level $V_{IN}$ again falls below the reference voltage VrefN. However, because the configuration of the comparator 224 and the flip-flop 226 of each of the level detect units is such that the primary/secondary data outputs of the flip-flop 226 can only change once between resets, the level detect units 122 and 123 do not respond to the change in the relationships between the voltage level $V_{IN}$ and the reference voltages Vref2 and VrefN and maintain their data outputs at their current states until the level detect units 122 and 123 are reset at time t7. In the example of FIG. 3, the voltage level $V_{IN}$ does not fall below the reference voltage Vref1, and thus the primary and complementary data outputs of the level detect unit 121 remain unchanged from their initial reset states for the entire detection period and the comparator 224 of the level detect unit 121 remains enabled during the entire detection period as shown by line 313.

At time t7, the detection period ends, as signaled by the transition of the reset signal 112 from the state "\R" to the state "R" (e.g., from logic "0" to logic "1"). At a time just before time t7 at the end of the detection period, the state of a data output of each of the level detect units 121-123 is latched or otherwise ascertained to determine the set of digital output values for the detection period from which the digital code value $C_{OUT}$ identifying the minimum voltage level of the analog input signal 101 is determined. In the example of FIG. 3, the complementary data outputs of each of the level detect units 121-123 is latched to store the value [001], which represents the minimum voltage level of the analog input signal 101 over the detection period. Alternately, the primary data outputs of each of the level detect units 121-123 could be latched to store the value [110], which could then be inverted by the decoder 110 (FIG. 1) to determined the digital code value 103 representative of the minimum level of the analog input signal 101 over the detection period.

In order to prepare the detect units 121-123 for the next detection period, the comparators 224 that were disabled during the current detection period need to be powered up for the next detection period. In one embodiment, the comparators 224 can be powered up concurrent with the start of the next detection period. However, for continuous operation the reset signal 112 typically is asserted for only a relatively short time, which may be too short to ensure proper power up of the comparators 224 in time for the next detection period. Accordingly, in an alternate embodiment, the power up of the disabled comparators 224 is initiated prior to the next detection period by asserting the enable signal 114 at time t6 prior to the end of the detection period at time t7, so as to help ensure that the comparators 224 are operational by the start of the next detection period. The same process illustrated by chart 300 then can be repeated for the next detection period occurring after the reset mode at time t7.

As line 321 of chart 300 illustrates, the comparator 224 of the level detect unit 123 was disabled from time t2 (when $V_{IN}$ fell below VrefN) until the end of the detection period at time t6 (at which point the power-up of the disabled comparators 224 is initiated). Likewise, as illustrated by line 317, the comparator 224 of the level detect unit 122 was disabled from time t3 (when $V_{IN}$ fell below Vref2) until near the end of the detection period. Thus, the comparator 224 of the level detect unit 123 consumed little to no power from time t2 to time t6, and the comparator 224 of the level detect unit 122 consumed little to no power from time t3 to time t6, thereby resulting in reduced overall power consumption compared to conventional peak detectors that do not allow the comparators to be disabled once they are no longer needed in detecting a peak voltage for a given duration.

FIG. 4 illustrates a chart 400 showing the operation of the digitizer 108 of FIG. 2 in a situation whereby the voltage level $V_{IN}$ of the analog input signal 101 is lower than the voltage Vref2 at the start of the detection period. In chart 400, levels 401, 402, and 403 represent the levels of reference voltages Vref1, Vref2, and VrefN, respectively, and line 404 represents the voltage level $V_{IN}$ of the analog input signal 101. Data value sequences 410 and 412 represent the data output states ("0" or "1") of the data signals output by the primary data output 234 and the complementary data output 236 of the flip-flop 226 of the level detect unit 121 and the line 413 represents the state of the enabling signal 230 for the level detect unit 121. Data value sequences 414 and 416 represent the data output states of the data signals output by the primary data output 234 and the complementary data output 236 of the flip-flop 226 of the level detect unit 122 and the line 417 represents the state of the enabling signal 230 for the level detect unit 122. Data value sequences 418 and 420 represent the data output states of the data signals output by the primary data output 234 and the complementary data output 236 of the flip-flop 226 of the level detect unit 123 and the line 421 represents the state of the enabling signal 230 for the level detect unit 123.

The start and end of the detection period of chart 400 are represented by times t1 and t4, respectively. Prior to the start of the detection period (e.g., at time t0), the reset signal 112 is set to the state "R" (logic "1" in this example), thereby resetting the flip-flops 226 of the level detect units 121-123 so that their primary data outputs are set to logic "0" ("\D") and their complementary data outputs are set to logic "1" ("D"). Further, prior to the start of the detection period, the enable signal 114 is asserted so as to initiate the power-up of the comparators 224 of the level detect units 121-123 so that the comparators 224 are fully operational at the start of the detection period at time t1.

At time t1, the start of the detection period is signaled by reconfiguring the reset signal 112 to state "\R" (e.g., logic "0"). Concurrently, the enable signal 114 is deasserted so as to allow the comparators 224 to be selectively enabled or disabled solely based on the state of the data outputs of the corresponding flip-flops 226 during the detection period. At the start of the detection period, the voltage level $V_{IN}$ is lower than reference voltages VrefN and Vref2 and higher than reference voltage Vref1, and thus the primary data output and the complementary data output of the level detect units 121 remain at logic "0" and logic "1", respectively, as set during the reset mode, whereas the primary data outputs and the complementary data outputs of the level detect units 122 and 123 switch to logic "1" and logic "0", respectively. Thus, the comparator 224 of the level detect units 121 remains enabled at time t1, whereas the comparators 224 of the level detect units 122 and 123 are disabled at time t1 and remain disabled until the end of the detection period at time t4. The level detect units 122 and 123 maintain their data outputs at their changed data states until the end of the detection period at time t4.

At time t2, the voltage level $V_{IN}$ rises above both reference voltages Vref2 and VrefN. However, because the configuration of the comparator 224 and the flip-flop 226 of each of the level detect units is such that the primary/secondary data outputs of the flip-flop 226 can only change once between resets, the level detect units 122 and 123 do not respond to the change in the relationships between the voltage level $V_{IN}$ and the reference voltages Vref2 and VrefN. In the example of FIG. 4, the voltage level $V_{IN}$ does not fall below the reference voltage Vref1, and thus the primary and complementary data outputs of the level detect unit 121 remain unchanged during the entire detection period and the comparator 224 of the level detect unit 121 remains enabled during the entire detection period as shown by line 413.

At time t4, the detection period ends, as signaled by the transition of the reset signal 112 from the state "\R" to the state "R" (e.g., from logic "0" to logic "1"). At a time just before t4 at the end of the detection period, the data output state of each of the level detect units 121-123 is latched or otherwise ascertained to determine the set of digital output values for the detection period from which the digital code value $C_{OUT}$ identifying the minimum voltage level of the analog input signal 101 is determined. In the example of FIG. 4, the complementary data output of each of the level detect units 121-123 is latched to store the value [001], which represents the minimum voltage level of the analog input signal 101 over the detection period. As similarly noted above with respect to FIG. 3, the enable signal 114 can be enabled at a time t3 prior to the end of the detection period at time t4 so as to initiate the power-up of the comparators 224 of the level detect units 121-124 prior to the start of the next detection period. Alternately, the power-up of the comparators 224 can be initiated concurrent with the start of the next detection period. The process illustrated by chart 400 can be repeated for the next detection period following the reset mode at time t4.

Figure 5:
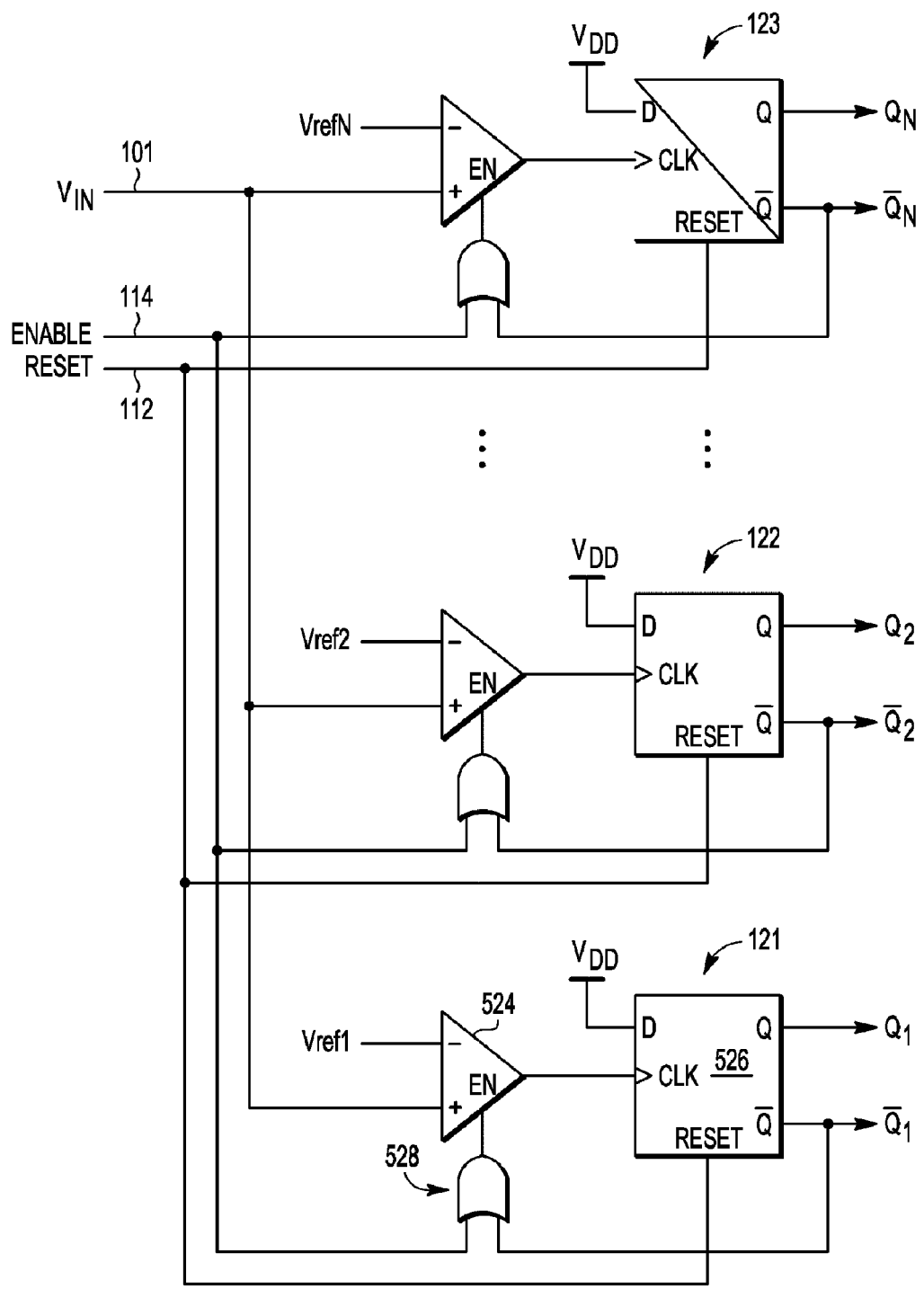
FIG. 5 is a diagram illustrating an example implementation of level detect units of the peak detection/digitization circuit of FIG. 1 for positive peak detection in accordance with at least one embodiment of the present disclosure.

FIG. 5 illustrates an example implementation of the digitizer 108 of the peak detection/digitization circuit 100 of FIG. 1 for positive peak detection in accordance with at least one embodiment of the present disclosure. Each of the level detect units 121-123 includes a comparator 524, a flip-flop 526, and an enable/disable mechanism 528 configured in the same manner as the comparator 224, the flip-flop 226, and the enable/disable mechanism 228 of FIG. 2, with the exception that the negative input of the comparator 524 of each of the level detect units 124 receives the corresponding reference voltage and the positive input of the comparator 524 receives the analog input signal 101 such that the comparator 524 configures its output to the state "C" when the voltage level $V_{IN}$ of the analog input signal 101 is higher than the corresponding reference voltage. Thus, the comparator 524 triggers the flip-flop 526 to latch the data state in response to the voltage level $V_{IN}$ increasing above the corresponding reference voltage, whereas in the implementation of FIG. 2 the comparator 224 triggers the flip-flop 226 to latch the data state in response to the voltage level $V_{IN}$ falling below the corresponding reference voltage.

Table 6, 7, and 8 summarize the operations of the comparator 524, flip-flop 526, and enable/disable mechanism 528 of a level detect unit of the implementation of FIG. 5.

TABLE 6

Operation of Comparator 524

| Mode | $V_{IN}$/VrefX | Output State |
|---|---|---|
| Disabled | X | X (0 or 1) |
| Enabled | $V_{IN}$ > VrefX | 1 |
| | $V_{IN}$ < VrefX | 0 |

TABLE 7

Operation of Flip-Flop 526

| Mode | Comparator Output | Primary Data Output | Complementary Data Output |
|---|---|---|---|
| Reset ("R") | X | 0 | 1 |
| Detect ("\R") | 1 | 1 | 0 |
| | 0 | Latch state of primary data output: 1) upon reset or 2) at clk = 1 → 0 transition | Latch state of complementary data output: 1) upon reset or 2) at clk = 1 → 0 transition |

TABLE 8

Operation of Enable/Disable Mechanism 528

| Enable Signal | Complementary Data Output 236 | Enabling Signal 230 |
|---|---|---|
| 0 | 0 | 0 |
| 0 | 1 | 1 |
| 1 | 0 | 1 |
| 1 | 1 | 1 |

Figure 6:
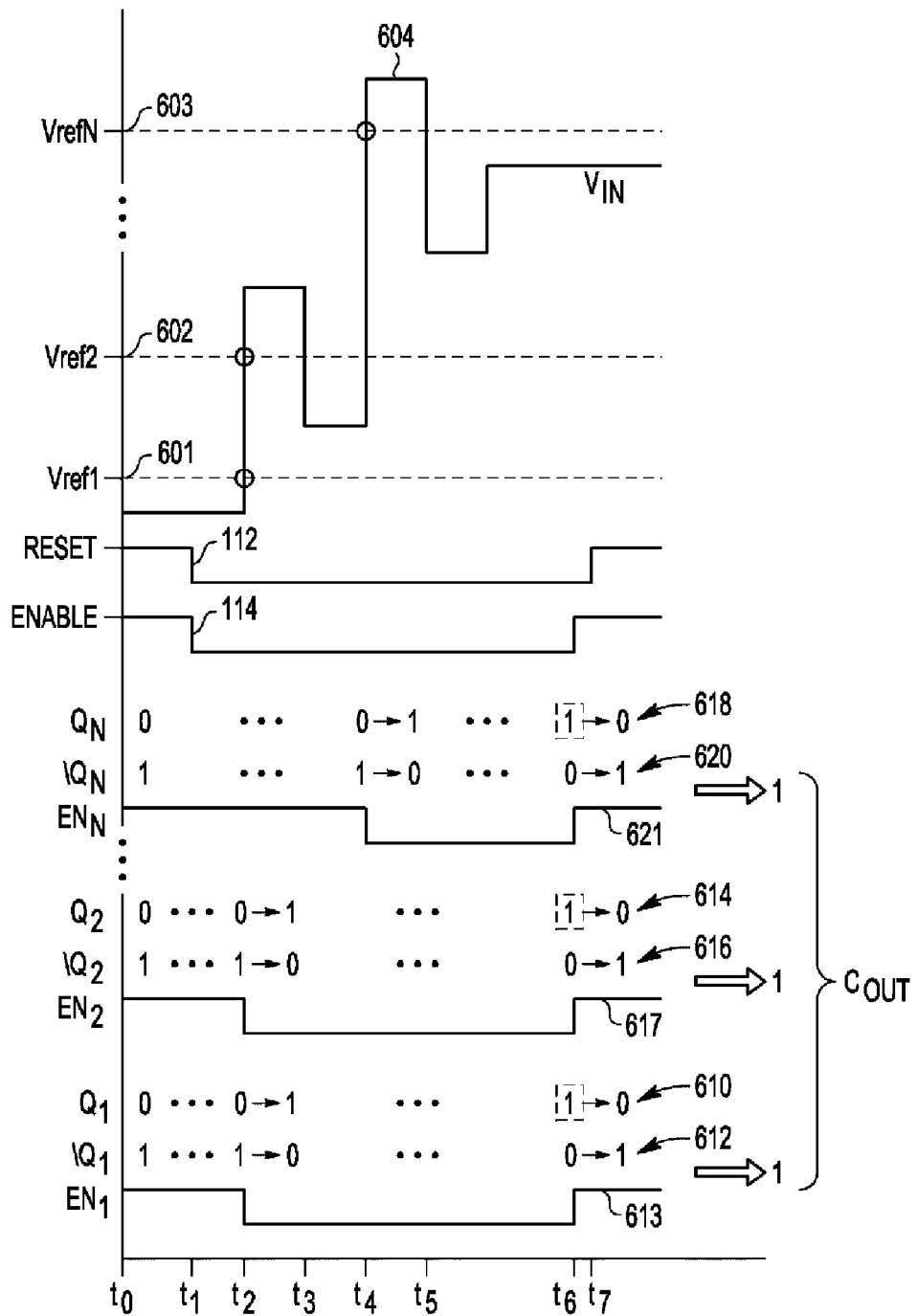
FIG. 6 is a chart illustrating an example operation of the implementation of FIG. 5 in accordance with at least one embodiment of the present disclosure.

FIG. 6 is a chart 600 illustrating an example operation of the implementation of the digitizer 108 of FIG. 5 for positive peak detection. The chart 600 illustrates the operation in a situation whereby the voltage level $V_{IN}$ of the analog input signal 101 is lower than the lowest reference voltage, Vref1, at the start of the detection period. In chart 600, levels 601, 602, and 603 represent the levels of reference voltages Vref1, Vref2, and VrefN, respectively, and line 604 represents the voltage level $V_{IN}$ of the analog input signal 101. Data value sequences 610 and 612 represent the data output states ("0" or "1") of the data signals by the primary data output and the complementary data output, respectively, of the flip-flop 526 of the level detect unit 121 and the line 613 represents the state of the enabling signal (e.g., enabling signal 230, FIG. 2) for the level detect unit 121. Data value sequences 614 and 616 represent the data output states of the data signals output by the primary data output and the complementary data output of the flip-flop 526 of the level detect unit 122 and the line 617 represents the state of the enabling signal for the level detect unit 122. Data value sequences 618 and 620 represent the data output states of the data signals output by the primary data output and the complementary data output of the flip-flop 526 of the level detect unit 123 and the line 621 represents the state of the enabling signal for the level detect unit 123. Ellipses (". . . ") are used in the data value sequences to indicate there is no change in the state of the corresponding data output.

The start and end of the detection period is represented by times t1 and t7, respectively. Prior to the start of the detection period (e.g., at time t0), the flip-flops 526 of the level detect units 121-123 are reset via the reset signal 112 so that their primary data outputs are set to logic "0" ("\D") and their complementary data outputs are set to logic "1" ("D"). Further, prior to the start of the detection period, the enable signal 114 is asserted so as to initiate the power-up of the comparators 524 of the level detect units 121-123 so that the comparators 524 are fully operational at the start of the detection period at time t1.

At time t1, the start of the detection period is signaled by reconfiguring the reset signal 112 to state "\R" (e.g., logic "0"). Concurrently, the enable signal 114 is deasserted so as to allow the comparators 524 to be selectively enabled or disabled solely based on the state of the data outputs of the corresponding flip-flops 526 during the detection period. At the start of the detection period, the voltage level $V_{IN}$ is lower than all of the reference voltages, and thus the primary data outputs of the level detect units 121-123 remain at logic "0" as set during the reset mode, and conversely, the complementary data outputs of the level detect units 121-123 remain at logic "1" as set during the reset mode. As the complementary data outputs are at logic "1", the enabling signals of the level detect units 121-123 remain asserted and thus the comparators 526 of the level detect units 121-123 remain enabled.

At time t2, the voltage level $V_{IN}$ increases above the reference voltages Vref1 and Vref2, which are associated with the level detect units 121 and 122, respectively. Consequently, in accordance with the operation of the comparator 524 and the flip-flop 526 described above, the primary data outputs of the flip-flops 526 of the level detect units 121 and 122 are inverted to a logic state "1" and the complementary data outputs of the level detect units 121 and 122 are inverted to a logic state "0" and remain in these states until the flip-flop 526 is reset at time t7. As a result, the enabling signals of the level detect units 121 and 122 are deasserted, thereby disabling the comparators 524 of the level detect units 121 and 122 until the enable signal 114 is asserted at a time t6 near the end of the detection period at time t7. Because the configuration of the comparator 524 and the flip-flop 526 of each of the level detect units is such that the primary/secondary data outputs of the flip-flop 526 can only change once between resets, the primary data outputs and the complementary data outputs of the level detect units 121 and 122 are maintained at their current states until the flip-flops 526 of the level detect units 121 and 122 are reset at the end of the detection period. Thus, the level detect units 121 and 122 retain their triggered states irrespective of any subsequent change in the voltage level $V_{IN}$ in the remaining portion of the detection period, such as when the voltage level $V_{IN}$ once again falls below the reference voltage Vref2 at time t3.

At time t4, the voltage level $V_{IN}$ increases above the reference voltage VrefN. In response, the level detect unit 123 inverts its primary and complementary data outputs and disables the comparator 524 of the level detect unit 123 in the manner described above. In this configuration, the level detect unit 123 does not alter the states of the primary and complementary data outputs regardless of the change in relationship between the voltage level $V_{IN}$ and the reference voltage VrefN, such as when the voltage level $V_{IN}$ falls below the reference voltage VrefN at time t5.

At time t7, the detection period ends, as signaled by the transition of the reset signal 112 from the state "\R" to the state "R" (e.g., from logic "0" to logic "1"). At a time just before time t7 at the end of the detection period, the state of a data output of each of the level detect units 121-123 is latched or otherwise ascertained to determine the set of digital output values for the detection period from which the digital code value $C_{OUT}$ identifying the maximum voltage level of the analog input signal 101 is determined. In the example of FIG. 6, the primary data outputs of each of the level detect units 121-123 are latched to store the value [111] for digital code value 103 ($C_{OUT}$), which represents the maximum voltage level of the analog input signal 101 over the detection period. Also, the enable signal 114 can be asserted at time t6 (prior to time t7) to initiate power-up of the disabled comparators 524 before the start of the next detection period. Alternately, the enable signal 114 can be asserted concurrent with the start of the next detection period. The process illustrated by chart 600 can be repeated for the next detection period occurring after the reset mode at time t7.

Figure 7:
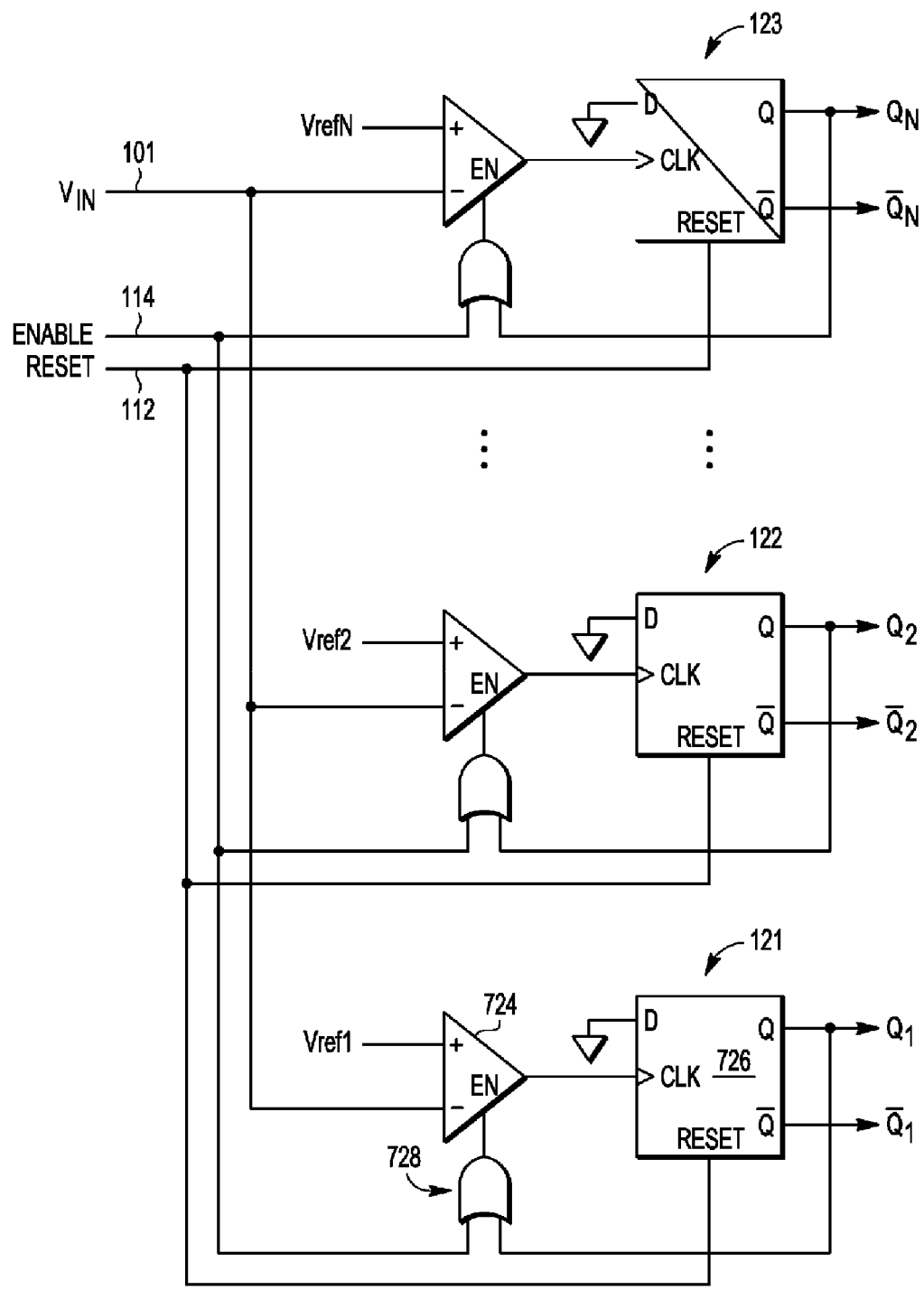
FIG. 7 is a diagram illustrating another example implementation of level detect units of the peak detection/digitization circuit of FIG. 1 for negative peak detection in accordance with at least one embodiment of the present disclosure.

FIG. 7 illustrates another example implementation of the digitizer 108 of the peak detection/digitization circuit 100 of FIG. 1 for negative peak detection in accordance with at least one embodiment of the present disclosure. Each of the level detect units 121-123 includes a comparator 724, a flip-flop 726, and an enable/disable mechanism 728 configured in the same manner as the comparator 224, the flip-flop 226, and the enable/disable mechanism 228 of FIG. 2, with the exception that the data input of the flip-flop 726 is coupled to ground (i.e., data input state "D"=logic "0")(as opposed to VDD or logic "1" in the implementation of FIG. 2) and one of the inputs of the logic-OR gate of the enable/disable mechanism 728 is connected to the primary data output of the flip-flop 726 (as opposed to the complementary data output as in the implementation of FIG. 2). Tables 9, 10, and 11 summarize the operations of the comparator 724, flip-flop 726, and enable/disable mechanism 728 of a level detect unit of the implementation of FIG. 7.

TABLE 9

Operation of Comparator 724

| Mode | $V_{IN}$/VrefX | Output State |
|---|---|---|
| Disabled | X | X (0 or 1) |
| Enabled | $V_{IN}$ < VrefX | 1 |
|  | $V_{IN}$ > VrefX | 0 |

TABLE 10

Operation of Flip-Flop 726

| Mode | Comparator Output | Primary Data Output | Complementary Data Output |
|---|---|---|---|
| Reset ("R") | X | 1 | 0 |
| Detect ("\R") | 1 | 0 | 1 |
|  | 0 | Latch state of primary data output: 1) upon reset or 2) at clk = 1 → 0 transition | Latch state of complementary data output: 1) upon reset or 2) at clk = 1 → 0 transition |

TABLE 11

Operation of Enable/Disable Mechanism 728

| Enable Signal | Primary Data Output | Enabling Signal |
|---|---|---|
| 0 | 0 | 0 |
| 0 | 1 | 1 |
| 1 | 0 | 1 |
| 1 | 1 | 1 |

Figure 8:
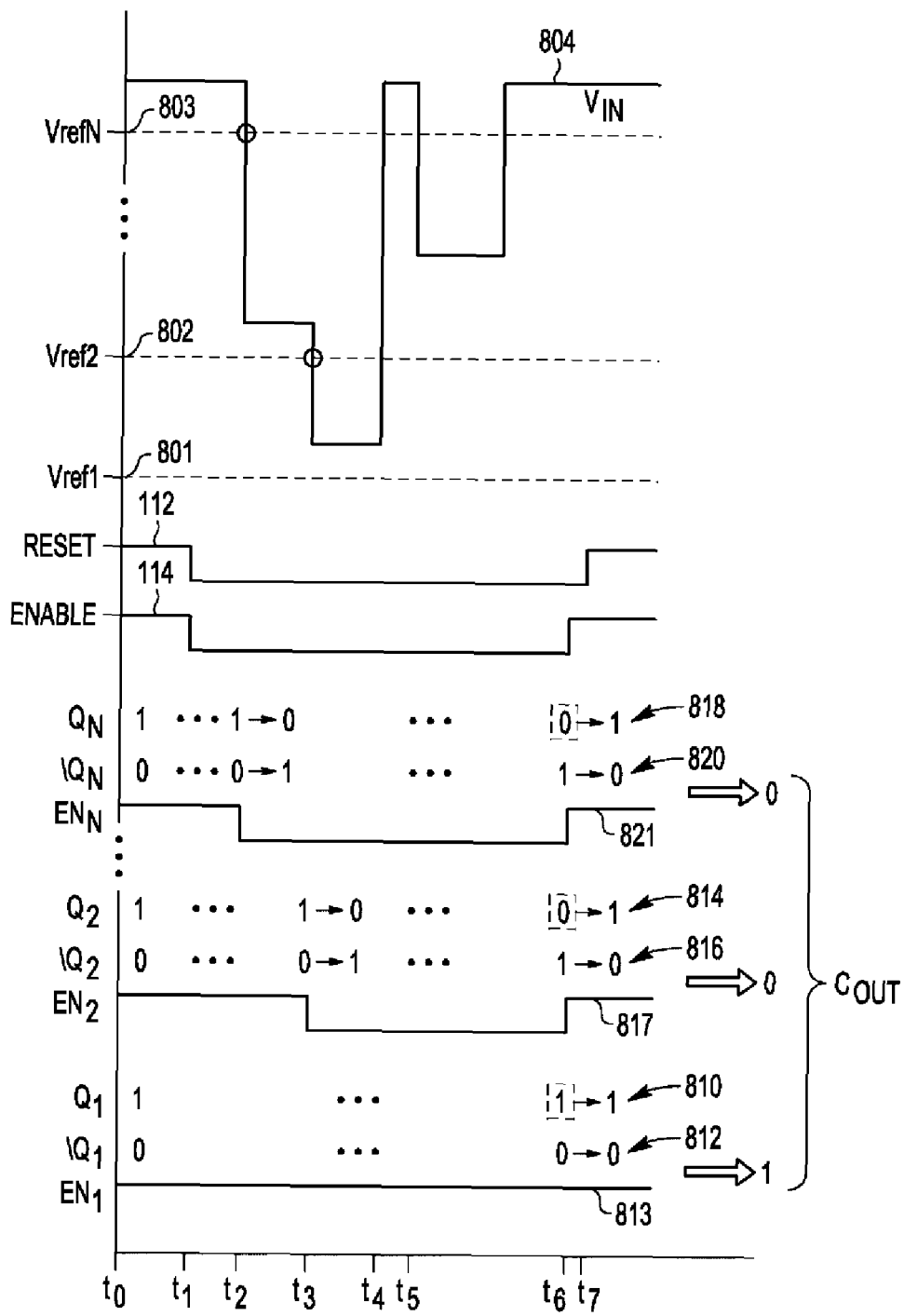
FIG. 8 is a chart illustrating an example operation of the implementation of FIG. 7 in accordance with at least one embodiment of the present disclosure.

FIG. 8 illustrates a chart 800 showing an example operation of the implementation of digitizer 108 of FIG. 7 for negative peak detection in a situation whereby the voltage level $V_{IN}$ of the analog input signal 101 is higher than the highest reference voltage VrefN at the start of the detection period. In chart 800, levels 801, 802, and 803 represent the levels of reference voltages Vref1, Vref2, and VrefN, respectively, and line 804 represents the voltage level $V_{IN}$ of the analog input signal 101. Data value sequences 810 and 812 represent the data output states of the data signals output by the primary data output and the complementary data output of the flip-flop 726 of the level detect unit 121 and the line 813 represents the state of the enabling signal (e.g., enabling signal 230, FIG. 2) for the level detect unit 121. Data value sequences 814 and 816 represent the data output states of the data signals output by the primary data output and the complementary data output of the flip-flop 726 of the level detect unit 122 and the line 817 represents the state of the enabling signal for the level detect unit 122. Data value sequences 818 and 820 represent the data output states of the data signals output by the primary data output and the complementary data output of the flip-flop 726 of the level detect unit 123 and the line 821 represents the state of the enabling signal for the level detect unit 123. Ellipses (" . . . ") are used in the data value sequences to indicate there is no change in the state of the corresponding data output.

The start and end of the detection period is represented by times t1 and t7, respectively. Prior to the start of the detection period (e.g., at time t0), the reset signal 112 is set to the state "R" (logic "1" in this example), thereby resetting the flip-flops 726 of the level detect units 121-123 so that their primary data outputs are set to logic "1" ("\D") and their complementary data outputs are set to logic "0" ("D"). Further, prior to the start of the detection period, the enable signal 114 is asserted so as to initiate the power-up of the comparators 724 of the level detect units 121-123 so that the comparators 724 are fully operational at the start of the detection period at time t1.

At time t1, the start of the detection period is signaled by reconfiguring the reset signal 112 to state "\R" (e.g., logic "0"). Concurrently, the enable signal 114 is deasserted so as to allow the comparators 724 to be selectively enabled or disabled solely based on the state of the data outputs of the corresponding flip-flops 726 during the detection period. At the start of the detection period, the voltage level $V_{IN}$ is higher than all of the reference voltages, and thus the primary data outputs of the level detect units 121-123 remain at logic "1" as set during the reset mode, and conversely, the complementary data outputs of the level detect units 121-123 remain at logic "0" as set during the reset mode. As the primary data outputs are at logic "1", the enabling signals of the level detect units 121-123 remain asserted and thus the comparators 724 of the level detect units 121-123 remain enabled.

At time t2, the voltage level $V_{IN}$ falls below the reference voltage VrefN, which is associated with the level detect unit 123. Consequently, in accordance with the operation of the comparator 724 and the flip-flop 726 described above, the primary data output of the flip-flop 726 of the level detect unit 123 is inverted to a logic state "0" and the complementary data output is inverted to a logic state "1" and the primary data output and the complementary data output are maintained at their current states until the end of the detection period. Thus, the level detect unit 123 retains this triggered state irrespective of the relationship between the reference voltage VrefN and the voltage level $V_{IN}$ in the remaining portion of the detection period, such as when the voltage level $V_{IN}$ once again becomes higher than the reference voltage VrefN at time t4 or again falls below the reference voltage VrefN at time t5. Further, as a result of the primary data output inverting to a logic state "0", the enabling signal of the level detect unit 123 is deasserted, thereby disabling the comparator 724 of the level detect unit 123 until the enable signal 114 is again asserted at or near the end of the detection period At time t3, the voltage level $V_{IN}$ falls below the reference voltage Vref2. In response, the level detect unit 122 inverts its primary and complementary data outputs and disables the comparator 724 of the level detect unit 122 in the manner described above with respect to the implementation of the level detect unit 123 in FIG. 7.

At time t4, the voltage level $V_{IN}$ again rises above both reference voltages Vref2 and VrefN and at time t5 the voltage level $V_{IN}$ again falls below the reference voltage VrefN. However, as the flip-flops 726 of the level detect units 122 and 123 can switch their data output states only once between resets, the level detect units 122 and 123 do not respond to the change in the relationships between the voltage level $V_{IN}$ and the reference voltages Vref2 and VrefN. In the example of FIG. 8, the voltage level $V_{IN}$ does not fall below the reference voltage Vref1, and thus the primary and complementary data outputs of the level detect unit 121 remain unchanged during the entire detection period and the comparator 724 of the level detect unit 121 remains enabled during the entire detection period.

At time t7, the detection period ends, as signaled by the transition of the reset signal 112 from the state "\R" to the state "R" (e.g., from logic "0" to logic "1"). At a time near the end of the detection period, the state of a data output of each of the level detect units 121-123 is latched or otherwise ascertained to determine the set of digital output values for the detection period from which the digital code value $C_{OUT}$ identifying the minimum voltage level of the analog input signal 101 is determined. Further, at a time t6 prior to time t7, the enable signal 114 is asserted so as to initiate the power-up of the disabled comparators 724 prior to the start of the next detection period. The process illustrated by chart 800 can be repeated for the next detection period occurring after the reset mode at time t7.

Figure 9:
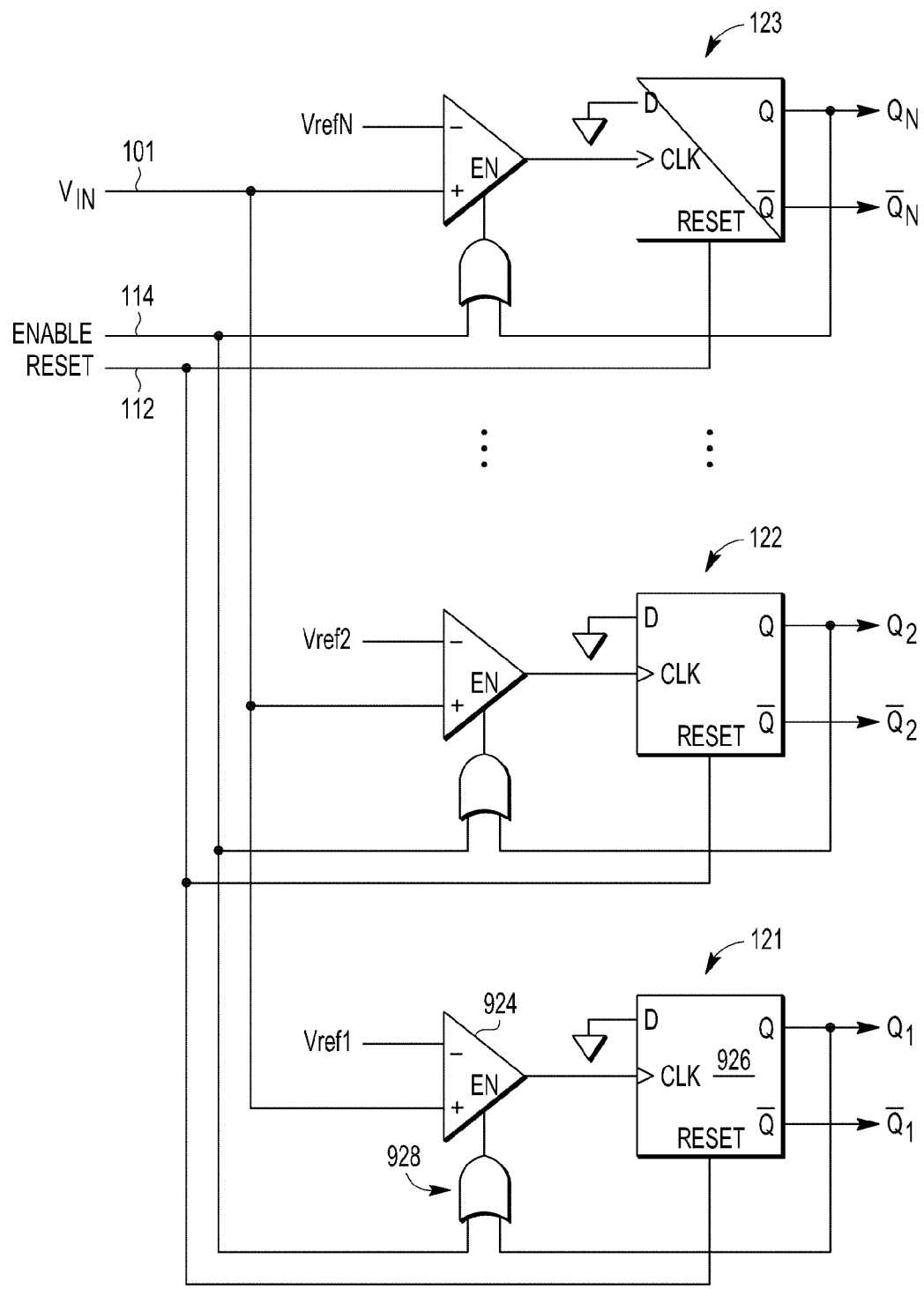
FIG. 9 is a diagram illustrating another example implementation of level detect units of the peak detection/digitization circuit of FIG. 1 for positive peak detection in accordance with at least one embodiment of the present disclosure.

FIG. 9 illustrates yet another example implementation of the digitizer 108 of the peak detection/digitization circuit 100 of FIG. 1 for positive peak detection in accordance with at least one embodiment of the present disclosure. Each of the level detect units 121-123 includes a comparator 924, a flip-flop 926, and an enable/disable mechanism 928 configured in the same manner as the comparator 524, the flip-flop 526, and the enable/disable mechanism 528 of FIG. 5, with the exception that the data input of the flip-flop 926 is coupled to ground (i.e., data input state "D"=logic "0")(as opposed to $V_{DD}$ or logic "1" in the implementation of FIG. 7) and one of the inputs of the logic-OR gate of the enable/disable mechanism 928 is connected to the primary data output of the flip-flop 926 (as opposed to the complementary data output as in the implementation of FIG. 9). Tables 12, 13, and 14 summarize the operations of the comparator 924, flip-flop 926, and enable/disable mechanism 928 of a level detect unit of the implementation of FIG. 9.

TABLE 12

Operation of Comparator 924

| Mode | $V_{IN}$/VrefX | Output State |
|---|---|---|
| Disabled | X | X (0 or 1) |
| Enabled | $V_{IN}$ > VrefX | 1 |
| | $V_{IN}$ < VrefX | 0 |

TABLE 13

Operation of Flip-Flop 926

| Mode | Comparator Output | Primary Data Output | Complementary Data Output |
|---|---|---|---|
| Reset ("R") | X | 1 | 0 |
| Detect ("\R") | 1 | 0 | 1 |
| | 0 | Latch state of primary data output: 1) upon reset or 2) at clk = 1 → 0 transition | Latch state of complementary data output: 1) upon reset or 2) at clk = 1 → 0 transition |

TABLE 14

Operation of Enable/Disable Mechanism 928

| Enable Signal | Primary Data Output | Enabling Signal |
|---|---|---|
| 0 | 0 | 0 |
| 0 | 1 | 1 |
| 1 | 0 | 1 |
| 1 | 1 | 1 |

Figure 10:
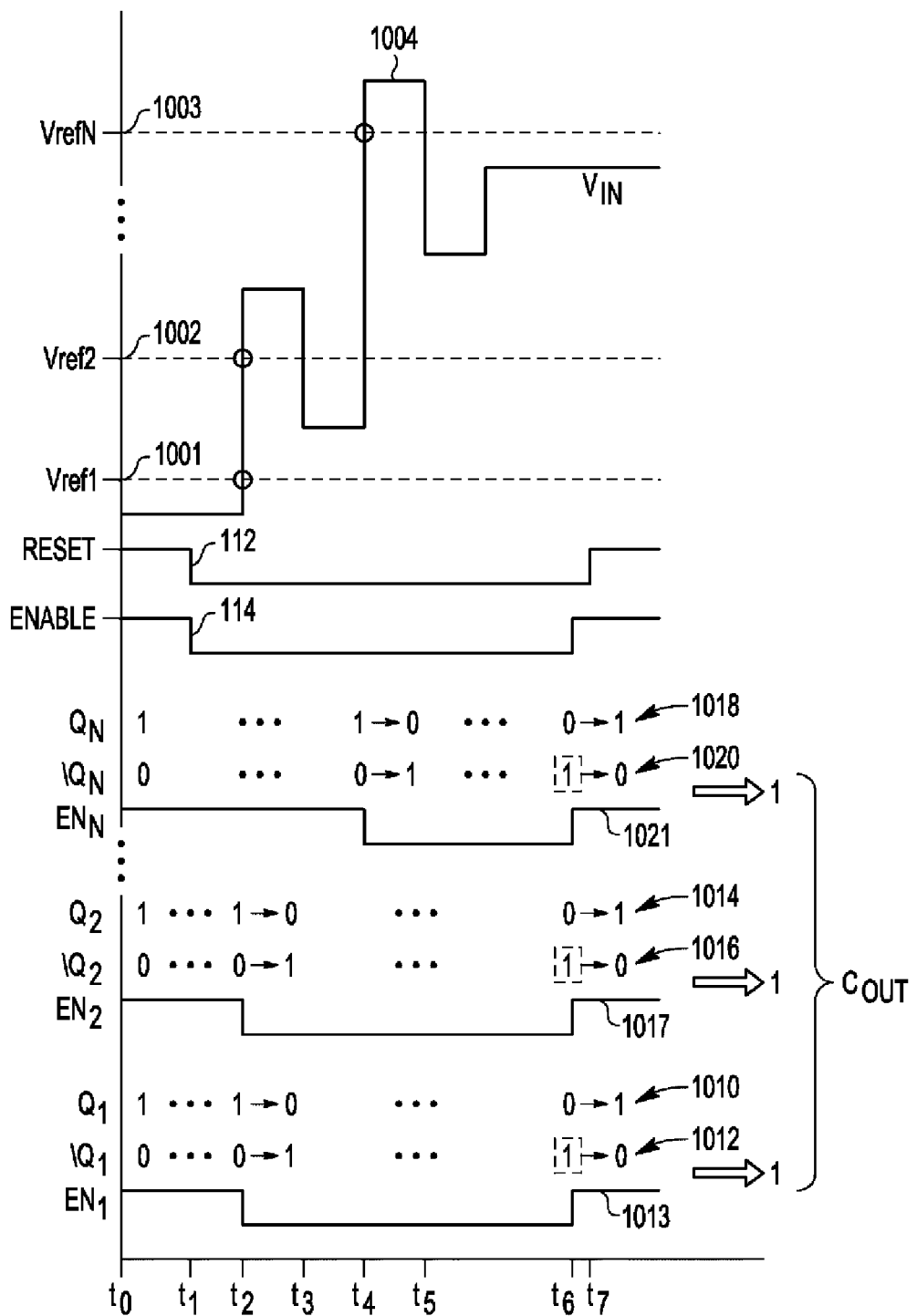
FIG. 10 is a chart illustrating an example operation of the implementation of FIG. 9 in accordance with at least one embodiment of the present disclosure.

FIG. 10 is a chart 1000 illustrating an example operation of the implementation of the digitizer 108 of FIG. 9 for positive peak detection. The chart 1000 illustrates the operation in a situation whereby the voltage level $V_{IN}$ of the analog input signal 101 is lower than the lowest reference voltage, Vref1 at the start of the detection period. In chart 1000, levels 1001, 1002, and 1003 represent the levels of reference voltages Vref1, Vref2, and VrefN, respectively, and line 1004 represents the voltage level $V_{IN}$ of the analog input signal 101. Data value sequences 1010 and 1012 represent the data output states of the data signals output by the primary data output and the complementary data output of the flip-flop 926 of the level detect unit 121 and the line 1013 represents the state of the enabling signal (e.g., enabling signal 230, FIG. 2) for the level detect unit 121. Data value sequences 1014 and 1016 represent the data output states of the data signals output by the primary data output and the complementary data output of the flip-flop 926 of the level detect unit 122 and the line 1017 represents the state of the enabling signal for the level detect unit 122. Data value sequences 1018 and 1020 represent the data output states of the data signals output by the primary data output and the complementary data output of the flip-flop 926 of the level detect unit 123 and the line 1021 represents the state of the enabling signal for the level detect unit 123.

The start and end of the detection period is represented by times t1 and t7, respectively. Prior to the start of the detection period (e.g., at time t0), the flip-flops 926 of the level detect units 121-123 are reset via the reset signal 112 so that their primary data outputs are set to logic "1" ("\D") and their complementary data outputs are set to logic "0" ("D"). Further, prior to the start of the detection period, the enable signal 114 is asserted so as to initiate the power-up of the comparators 924 of the level detect units 121-123 so that the comparators 924 are fully operational at the start of the detection period at time t1.

At time t1, the start of the detection period is signaled by reconfiguring the reset signal 112 to state "\R" (e.g., logic "0"). Concurrently, the enable signal 114 is deasserted so as to allow the comparators 924 to be selectively enabled or disabled solely based on the state of the data outputs of the corresponding flip-flops 926 during the detection period. At the start of the detection period, the voltage level $V_{IN}$ is lower than all of the reference voltages, and thus the primary data outputs of the level detect units 121-123 remain at logic "1" as set during the reset mode, and conversely, the complementary data outputs of the level detect units 121-123 remain at logic "0" as set during the reset mode. As the primary data outputs are at logic "1", the enabling signals of the level detect units 121-123 remain asserted and thus the comparators 926 of the level detect units 121-123 remain enabled.

At time t2, the voltage level $V_{IN}$ increases above the reference voltages Vref1 and Vref2, which are associated with the level detect units 121 and 122, respectively. Consequently, the primary data outputs of the flip-flops 926 of the level detect units 121 and 122 are inverted to a logic state "0" and the complementary data outputs of the level detect units 121 and 122 are inverted to a logic state "1". Because the flip-flops 926 can invert their data outputs only once between resets, the data outputs of the flip-flops 926 are maintained in these states until reset at the end of the detection period at time t7. Thus, the level detect units 121 and 122 retain their triggered states irrespective of any subsequent change in the voltage level $V_{IN}$ in the remaining portion of the detection period, such as when the voltage level $V_{IN}$ once again falls below the reference voltage Vref2 at time t3. As a result of the inversion of the primary data outputs of the flip-flops 926 of the level detect units 121 and 122, the enabling signals of the level detect units 121 and 122 are deasserted, thereby disabling the comparators 924 of the level detect units 121 and 122 until the enable signal 114 is reasserted at time t6 near the end of the detection period.

At time t4, the voltage level $V_{IN}$ increases above the reference voltage VrefN. In response, the level detect unit 123 inverts its primary and complementary data outputs and disables the comparator 924 of the level detect unit 123 in the manner described above. In this configuration, the level detect unit 123 does not alter the states of the primary and complementary data outputs regardless of the change in relationship between the voltage level $V_{IN}$ and the reference voltage VrefN, such as when the voltage level $V_{IN}$ falls below the reference voltage VrefN at time t5.

At time t7, the detection period ends, as signaled by the transition of the reset signal 112 from the state "\R" to the state "R" (e.g., from logic "0" to logic "1"). At a time near to the end of the detection period, the state of a data output of each of the level detect units 121-123 is latched or otherwise ascertained to determine the set of digital output values for the detection period from which the digital code value $C_{OUT}$ identifying the maximum voltage level of the analog input signal 101 is determined. In the example of FIG. 10, the complementary data outputs of each of the level detect units 121-123 are latched to store the value [111] for digital code value 103 ($C_{OUT}$), which represents the maximum voltage level of the analog input signal 101 over the detection period. The process illustrated by chart 1000 can be repeated for a following detection period occurring after the reset mode at time t7. Further, at a time t6 prior to time t7 the enable signal 114 can be asserted so as to initiate power-up of the disabled comparators 924 prior to the start of the following detection period so as to help ensure that the comparators 924 are fully operational at the start of the following detection period.

FIGS. 11 and 12 illustrate example implementations of the peak detection/digitization circuit 100 for dynamic power management in a light emitting diode (LED) system having a plurality of LED strings. The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

FIG. 11 illustrates a LED system 1100 having dynamic power management in accordance with at least one embodiment of the present disclosure. In the depicted example, the LED system 1100 includes a LED panel 1102 and a LED driver 1104. The LED panel 1102 includes a plurality of LED strings (e.g., LED strings 1105, 1106, 1107, and 1108). Each LED string includes one or more LEDs 1109 connected in series. The LEDs 1109 can include, for example, white LEDs, red, green, blue (RGB) LEDs, organic LEDs (OLEDs), etc. Each LED string is driven by the adjustable voltage $V_{OUT}$ received at the head end of the LED string from a voltage source 1112 of the LED driver 1104 via a voltage bus 1110 (e.g., a conductive trace, wire, etc.). In the embodiment of FIG. 11, the voltage source 1112 is implemented as a boost converter configured to drive the output voltage $V_{OUT}$ using a supplied input voltage.

The LED driver 1104 includes a feedback controller 1114 configured to control the voltage source 1112 based on the tail voltages at the tail ends of the LED strings 1105-1108. The LED driver 1104, in one embodiment, receives display data representative of which of the LED strings 1105-1108 are to be activated and at what times during a corresponding PWM cycle, and the LED driver 1104 is configured to either collectively or individually activate the LED strings 1105-1108 at the appropriate times in their respective PWM cycles based on the display data.

The feedback controller 1114, in one embodiment, includes a plurality of current regulators (e.g., current regulators 1115, 1116, 1117, and 1118), a code generation module 1120 (comprising an analog string select module 1121 and a negative peak detection/digitization circuit 1122), a code processing module 1124, a control digital-to-analog converter (DAC) 1126, an error amplifier 1128, and a data/timing controller 1130. In the example of FIG. 11, the current regulator 1115 is configured to maintain the current $I_1$ flowing through the LED string 1105 at or near a fixed current (e.g., 30 mA) when active. Likewise, the current regulators 1116, 1117, and 1118 are configured to maintain the currents $I_2$, $I_3$, and $I_4$ flowing through the LED strings 1106, 1107, and 1108, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 1115-1118 are connected to the tail ends of the LED strings 1105-1108, respectively, the tail voltages of the LED strings 1105-1108 represent the amounts of headroom available at the corresponding current regulators 1115-1118. However, headroom in excess of that necessary for current regulation purposes results in unnecessary power consumption by the current regulator. Accordingly, as described in greater detail herein, the LED system 1100 employs techniques to provide dynamic headroom control so as to maintain the minimum tail voltage of the active LED strings at or near a predetermined threshold voltage, thus maintaining the lowest headroom of the current regulators 1115-1118 at or near the predetermined threshold voltage. The threshold voltage can represent a determined balance between the need for sufficient headroom to permit proper current regulation by the current regulators 1115-1118 and the advantage of reduced power consumption by reducing the excess headroom at the current regulators 1115-1118.

The data/timing controller 1130 receives display data and is configured to provide control signals to the other components of the LED driver 1104 based on the timing and activation information represented by the display data. To illustrate, the data/timing controller 1130 can provide control signals (not shown) to the current control regulators 1115-1118 to control which of the LED strings 1105-1108 are active during corresponding portions of their respective PWM cycles. The data/timing controller 1130 also provides control signals to the negative peak detect/digitization circuit 1122, the code processing module 1124, and the control DAC 1126 so as to control the operation and timing of these components, such as to signal the start and end of detection periods. The data/timing controller 1130 can be implemented as hardware, software executed by one or more processors, or a combination thereof. To illustrate, the data/timing controller 1130 can be implemented as a logic-based hardware state machine.

The analog string select module 1121 includes a plurality of tail inputs coupled to the tail ends of the LED strings 1105-1108 to receive the tail voltages $V_{T1}$, $V_{T2}$, $V_{T3}$, and $V_{T4}$ of the LED strings 1105-1108, respectively, and an output to provide an analog signal 1132 representative of the minimum tail voltage $V_{Tmin}$ of the LED strings 1105-1108 at any given point over a detection period. In one embodiment, the analog string select module 1121 is implemented as a diode-OR circuit having a plurality of inputs connected to the tail ends of the LED strings 1105-1108 and an output to provide the analog signal 1132.

The negative peak detection/digitization circuit 1122 is configured to detect the minimum voltage level of the analog signal 1132 over a detection period signaled by the data/timing controller 1132 (and thus detect the minimum tail voltage over the detection period) and provide a digital code value $C_{OUT}$ representative of the detected minimum voltage (or negative peak voltage) of the analog signal 1132 for the detection period. The negative peak detection/digitization circuit 1122, in one embodiment, is implemented in accordance with the negative peak detection implementation of the peak detection/digitization circuit 100 described above with reference to FIGS. 1-4, 7 and 8.

The code processing module 1124 includes an input to receive the code value $C_{OUT}$ for a detection period and an output to provide a code value $C_{reg}$ based on the code value $C_{OUT}$ and either a previous value for $C_{reg}$ from a previous detection period or an initialization value. As the code value $C_{OUT}$ represents the minimum tail voltage that occurred during the detection period (e.g., a PWM cycle, a display frame period, etc.) for all of the LED strings 1105-1108, the code processing module 1124, in one embodiment, compares the code value $C_{OUT}$ to a threshold code value, $C_{thresh}$, and generates a code value $C_{reg}$ based on the comparison. The code processing module 1124 can be implemented as hardware, software executed by one or more processors, or a combination thereof. To illustrate, the code processing module 1124 can be implemented as a logic-based hardware state machine, software executed by a processor, and the like.

The control DAC 1126 includes an input to receive the code value $C_{reg}$ and an output to provide a regulation voltage $V_{reg}$ representative of the code value $C_{reg}$. The regulation voltage $V_{reg}$ is provided to the error amplifier 1128. The error amplifier 1128 also receives a feedback voltage $V_{fb}$ representative of the output voltage $V_{OUT}$. In the illustrated embodiment, a voltage divider 1140 is used to generate the voltage $V_{fb}$ from the output voltage $V_{OUT}$. The error amplifier 1128 compares the voltage $V_{fb}$ and the voltage $V_{reg}$ and configures a signal ADJ based on this comparison. The voltage source 1112 receives the signal ADJ and adjusts the output voltage $V_{OUT}$ based on the magnitude of the signal ADJ.

There may be considerable variation between the voltage drops across each of the LED strings 1105-1108 due to static variations in forward-voltage biases of the LEDs 1109 of each LED string and dynamic variations due to the on/off cycling of the LEDs 1109. Thus, there may be significant variance in the bias voltages needed to properly operate the LED strings 1105-1108. However, rather than drive a fixed output voltage $V_{OUT}$ that is substantially higher than what is needed for the smallest voltage drop as this is handled in conventional LED drivers, the LED driver 1104 illustrated in FIG. 11 utilizes a feedback mechanism that permits the output voltage $V_{OUT}$ to be adjusted so as to reduce or minimize the power consumption of the LED driver 1104 in the presence of variances in voltage drop across the LED strings 1105-1108. For ease of discussion, the feedback duration of this mechanism is described in the context of a PWM cycle-by-PWM cycle basis for adjusting the output voltage $V_{OUT}$. However, any of a variety of durations may be used for this feedback mechanism without departing from the scope of the present disclosure. To illustrate, the feedback duration could encompass a portion of a PWM cycle, multiple PWM cycles, a certain number of clock cycles, a duration between interrupts, a duration related to video display such as video frame, and the like.

FIG. 12 illustrates an alternate implementation of the code generation module 1120 of the LED driver 1104 in the LED system 1100 of FIG. 11. Rather than utilizing a single negative peak detection/digitization circuit for multiple LED strings as described in FIG. 11, the depicted implementation of FIG. 12 utilizes a negative peak detection/digitization circuit to for each LED string. Accordingly, the code generation module 1120 includes a plurality of negative peak detection/digitization circuits (e.g., negative peak detection/digitization circuits 1205-1208) and a digital minimum detect module 1210. The negative peak detection/digitization circuit 1205 includes an input coupled to the tail end of the LED string 1105 and an output to provide a code value $C_1$ representative of the minimum voltage of the tail end of the LED string 1105 over a detection period (e.g., a PWM cycle or a display frame) in a manner described above with respect to the negative peak detection/digitization implementation of the peak detection/digitization circuit 100 described above with reference to FIGS. 1-4, 7 and 8. The negative peak detection/digitization circuits 1206-1208 are similarly configured with respect to LED strings 1106-1108 for the generation of code values $C_2$, $C_3$, and $C_4$, respectively, for a detection period. At the end of a detection period, the digital minimum select module 1210 identifies the lowest of the code values C1, C2, C3, and C4 and forwards this lowest code value as the code value $C_{OUT}$ for processing by the code processing module 1124 as described above.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A circuit comprising:
    a signal input to receive an input signal;
    a digital output to provide a multiple-bit digital value;
    a plurality of level detect units, each level detect unit comprising:
        a comparator comprising a first input to receive the input signal, a second input to receive a corresponding reference voltage of a plurality of reference voltages, an output to configure a comparator signal based on a comparison of the input signal to the corresponding reference voltage, and an enable input to receive a local enable signal; and
        a flip-flop comprising a data input fixed to a predetermined first data state, a clock input coupled to the output of the comparator, a reset input to receive a reset signal, and a first data output to provide a first data signal, the flip-flop to:
            responsive to the reset signal having a first reset state, configure the first data signal to a second data state that is the complement of the first data state;
            responsive to the comparator signal having a first comparator state while the reset signal has a second reset state, configure the first data signal to the first data state and maintain the first data signal at the first data state until the reset signal is reconfigured to the first reset state; and
            responsive to the comparator signal having a second comparator state while the reset signal has the second reset state, maintain a present data state of the first data signal until the reset signal is reconfigured to the first reset state; and
    an enable circuit to configure the local enable signal to selectively disable the comparator based at least in part on the first data signal.

2. The circuit of claim 1, wherein the enable circuit is to configure the local enable signal further based on a global enable signal.

3. The circuit of claim 2, wherein the enable circuit comprises an OR logic gate comprising a first input to receive a signal based on the first data signal, a second input to receive a global enable signal, and an output to provide the local enable signal.

4. The circuit of claim 2, further comprising:
    a controller to configure the reset signal and the global enable signal based on a reference control signal.

5. The circuit of claim 4, wherein the controller is to configure the global enable signal to a first enable state prior to configuring the reset signal to the first reset state and to configure the global enable signal to a second enable state concurrent with or after configuring the reset signal to the second reset state.

6. The circuit of claim 1, wherein the flip-flop further comprises a second data output to provide a second data signal, the first data signal and the second data signal comprising complementary data signals.

7. The circuit of claim 1, wherein:
    the comparator configures the comparator signal to the first comparator state responsive to the input signal having a voltage lower than the corresponding reference voltage and configures the comparator signal to the second comparator state responsive to the input signal having a voltage not lower than the corresponding reference voltage.

8. The circuit of claim 1, wherein:
    the comparator configures the comparator signal to the first comparator state responsive to the input signal having a voltage higher than the corresponding reference voltage and configures the comparator signal to the second comparator state responsive to the input signal having a voltage not higher than the corresponding reference voltage.

9. The circuit of claim 1, further comprising:
    an output configured to provide an output voltage to a head end of each light emitting diode (LED) string of a plurality of LED strings;
    a plurality of tail inputs, each tail input configured to couple to a tail end of a corresponding LED string of the plurality of LED strings; and
    a feedback controller coupled to the plurality of tail inputs; and
    wherein:
        the input signal comprises a minimum tail voltage of the plurality of LED strings;
        the multiple-bit digital value comprises a digital code value representative of a minimum voltage of the input signal over a first duration; and
        the feedback controller configured to adjust the output voltage for a second duration subsequent to a first duration based on the output voltage and the digital code value.

10. A method comprising:
providing a peak detection/digitization circuit comprising a plurality of level detect units, each level detect unit comprising a comparator and a flip-flop;
receiving an input signal;
for a detection period:
for each level detect unit:
configuring a data output signal of the flip-flop of the level detect unit to a first data state responsive to a start of the detection period;
enabling the comparator responsive to the data output signal having the first data state;
disabling the comparator responsive to the data output signal having a second data state; and
while the comparator of the level detect unit is enabled during the detection period, configuring the data output signal of the flip-flop responsive to a comparison of the input signal to a corresponding reference voltage of a plurality of reference voltages at the comparator; and
latching the data output signals of the flip-flops of the level detect units at an end of the detection period to determine a multiple-bit digital value representative of a peak voltage level of the input signal over the detection period.

11. The method of claim 10, wherein configuring the data output signal of the flip-flop responsive to the comparison of the input signal to the corresponding reference voltage comprises:
configuring the data output signal of the flip-flop to the first data state responsive to the comparison indicating a voltage of the input signal is higher than the corresponding reference voltage; and
configuring the data output signal of the flip-flop to the second data state responsive to the comparison indicating the voltage of the input signal is not higher than the corresponding reference voltage.

12. The method of claim 10, wherein configuring the data output signal of the flip-flop responsive to the comparison of the input signal to the corresponding reference voltage comprises:
configuring the data output signal of the flip-flop to the first data state responsive to the comparison indicating a voltage of the input signal is lower than the corresponding reference voltage; and
configuring the data output signal of the flip-flop to the second data state responsive to the comparison indicating the voltage of the input signal is not lower than the corresponding reference voltage.

13. The method of claim 10, further comprising:
for each level detect unit:
enabling the comparator of the level detect unit responsive to a global enable signal having a first enable state; and
wherein disabling the comparator comprises disabling the comparator responsive to both the data output signal having the second data output state and the global enable signal having a second enable state.

14. The method of claim 13, further comprising:
configuring the global enable signal to the second enable state concurrent with the start of the detection period; and
configuring the global enable signal to the first enable state prior to the start of the detection period.

15. The method of claim 10, further comprising:
providing an output voltage to a head end of each light emitting diode (LED) string of a plurality of LED strings, wherein the input signal comprises a minimum tail voltage of the plurality of LED strings and the multiple-bit digital value represents a minimum tail voltage of the plurality of LED strings over the detection period; and
adjusting the output voltage for another period following the detection period based on the multiple-bit digital value.

16. A circuit comprising:
an output configured to provide an output voltage to a head end of each light emitting diode (LED) string of a plurality of LED strings;
a plurality of tail inputs, each tail input configured to couple to a tail end of a corresponding LED string of the plurality of LED strings; and
a feedback controller coupled to the plurality of tail inputs and comprising:
a peak detection/digitization circuit configured to determine a digital code value representative of a minimum tail voltage of at least one of the plurality of LED strings over a first duration; and
the feedback controller configured to adjust the output voltage for a second duration subsequent to the first duration based on the output voltage and the digital code value; and
wherein the peak detection/digitization circuit comprises:
a signal input to receive the minimum tail voltage;
a digital output to provide the digital code value;
a plurality of level detect units, each level detect unit comprising:
a comparator comprising a first input to receive the analog signal, a second input to receive a corresponding reference voltage of a plurality of reference voltages, an output to configure a comparator signal based on a comparison of the analog signal to the corresponding reference voltage, and an enable input to receive a local enable signal; and
a flip-flop comprising a data input fixed to a predetermined first data state, a clock input coupled to the output of the comparator, a reset input to receive a reset signal representative of a timing of the first duration and the second duration, and a first data output to provide a first data signal, the flip-flop to:
responsive to the reset signal having a first reset state, configure the first data signal to a second data state that is the complement of the first data state;
responsive to the comparator signal having a first comparator state while the reset signal has a second reset state, configure the first data signal to the first data state and maintain the first data signal at the first data state until the reset signal is reconfigured to the first reset state; and
responsive to the comparator signal having a second comparator state while the reset signal has the second reset state, maintain a present data state of the first data signal until the reset signal is reconfigured to the first reset state; and
an enable circuit to configure the local enable signal to selectively disable the comparator based at least in part on the first data signal.

17. The LED driver of claim 16, wherein:
the comparator configures the comparator signal to the first comparator state responsive to the input signal having a voltage lower than the corresponding reference voltage and configures the comparator signal to the second comparator state responsive to the input signal having a voltage not lower than the corresponding reference voltage.

18. The LED driver of claim 16, wherein the enable circuit is to configure the local enable signal further based on a global enable signal.

19. The LED driver of claim 18, wherein the LED driver is to configure the global enable signal to a first enable state prior to configuring the reset signal to the first reset state and to configure the global enable signal to a second enable state concurrent with or after configuring the reset signal to the second reset state.

20. The LED driver of claim 16, further comprising:
a minimum select module configured to provide the minimum tail voltage of the tail voltages of the plurality of LED strings to the signal input over the first duration.

* * * * *